US011956968B2

(12) United States Patent
Wu et al.

(10) Patent No.: US 11,956,968 B2
(45) Date of Patent: Apr. 9, 2024

(54) MEMORY DEVICE

(71) Applicant: Taiwan Semiconductor Manufacturing Company, Ltd., Hsinchu (TW)

(72) Inventors: Chao-I Wu, Hsinchu County (TW); Yu-Ming Lin, Hsinchu (TW); Sai-Hooi Yeong, Hsinchu County (TW); Han-Jong Chia, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/884,578

(22) Filed: Aug. 10, 2022

(65) Prior Publication Data

US 2022/0392920 A1 Dec. 8, 2022

Related U.S. Application Data

(62) Division of application No. 17/086,463, filed on Nov. 2, 2020.

(Continued)

(51) Int. Cl.

*H10B 51/10* (2023.01)
*H01L 21/28* (2006.01)
*H01L 23/522* (2006.01)

(Continued)

(52) U.S. Cl.

CPC ......... *H10B 51/10* (2023.02); *H01L 23/5226* (2013.01); *H01L 29/40111* (2019.08);

(Continued)

(58) Field of Classification Search

CPC ........ H10B 51/20; H10B 51/10; H10B 51/30; H01L 23/5226; H01L 29/40111;

(Continued)

(56) References Cited

U.S. PATENT DOCUMENTS 8,772,109 B2 7/2014 Colinge
8,785,285 B2 7/2014 Tsai et al.

(Continued)

FOREIGN PATENT DOCUMENTS

KR 20190114253 10/2019

OTHER PUBLICATIONS

"Office Action of Korea Counterpart Application", dated Aug. 31, 2022, p. 1-p. 3.

*Primary Examiner* — Shouxiang Hu
(74) *Attorney, Agent, or Firm* — JCIPRNET

(57) ABSTRACT

Provided are a memory device and a method of forming the same. The memory device includes a first tier on a substrate and a second tier on the first tier. The first tier includes a first layer stack; a first gate electrode penetrating through the first layer stack; a first channel layer between the first layer stack and the first gate electrode; and a first ferroelectric layer between the first channel layer and the first gate electrode. The second tier includes a second layer stack; a second gate electrode penetrating through the second layer stack; a second channel layer between the second layer stack and the second gate electrode; and a second ferroelectric layer between the second channel layer and the second gate electrode.

16 Claims, 21 Drawing Sheets

Related U.S. Application Data

(60) Provisional application No. 63/040,765, filed on Jun. 18, 2020.

(51) Int. Cl.

| | |
|---|---|
| ***H01L 29/51*** | (2006.01) |
| ***H01L 29/66*** | (2006.01) |
| ***H01L 29/78*** | (2006.01) |
| ***H10B 51/20*** | (2023.01) |
| ***H10B 51/30*** | (2023.01) |

(52) U.S. Cl.
CPC ...... *H01L 29/516* (2013.01); *H01L 29/66666* (2013.01); *H01L 29/78391* (2014.09); *H10B 51/20* (2023.02); *H10B 51/30* (2023.02)

(58) Field of Classification Search
CPC ............. H01L 29/516; H01L 29/66666; H01L 29/78391; H01L 29/66545; H01L 29/6684
See application file for complete search history.

(56) References Cited

U.S. PATENT DOCUMENTS

| | | | | |
|---|---|---|---|---|
| 8,816,444 | B2 | 8/2014 | Wann et al. | |
| 8,823,065 | B2 | 9/2014 | Wang et al. | |
| 8,860,148 | B2 | 10/2014 | Hu et al. | |
| 9,105,490 | B2 | 8/2015 | Wang et al. | |
| 9,236,267 | B2 | 1/2016 | De et al. | |
| 9,236,300 | B2 | 1/2016 | Liaw | |
| 9,520,482 | B1 | 12/2016 | Chang et al. | |
| 9,576,814 | B2 | 2/2017 | Wu et al. | |
| 9,837,435 | B1 | 12/2017 | Chang et al. | |
| 10,403,631 | B1 * | 9/2019 | Lu | H01L 21/76829 |
| 11,282,848 | B2 * | 3/2022 | Makala | H10B 51/20 |
| 2019/0304993 | A1 | 10/2019 | Lee et al. | |
| 2021/0175253 | A1 * | 6/2021 | Han | H10B 51/10 |
| 2021/0193677 | A1 * | 6/2021 | Lue | H10B 43/30 |

* cited by examiner

500
T2
T1
210
216
218
212
214
110
118
116
114
112
227
226b
228b
228a
226a
126
128
101
150
226
226a
226b
228
P1
128
130(Vd1)
228a
228b
P2
128
130(Vs1)
228a
Vg1
Vg2
Vg3
Vg4
Vs1
Vd1
130
230
229G(229)
240
245
140
145
120
122
124
125

MEMORY DEVICE

CROSS-REFERENCE TO RELATED APPLICATION

This is a divisional application of and claims the priority benefit of U.S. application Ser. No. 17/086,463, filed on Nov. 2, 2020, which claims the priority benefit of U.S. provisional application Ser. No. 63/040,765, filed on Jun. 18, 2020. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional (3D) memory device, such as a 3D NOR-type memory, has been introduced to replace a planar memory device. However, 3D memory device has not been entirely satisfactory in all respects, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 6A are cross-sectional views of a method of forming a three-dimensional (3D) memory device in accordance with a first embodiment.

DETAILED DESCRIPTION

Figure 1:
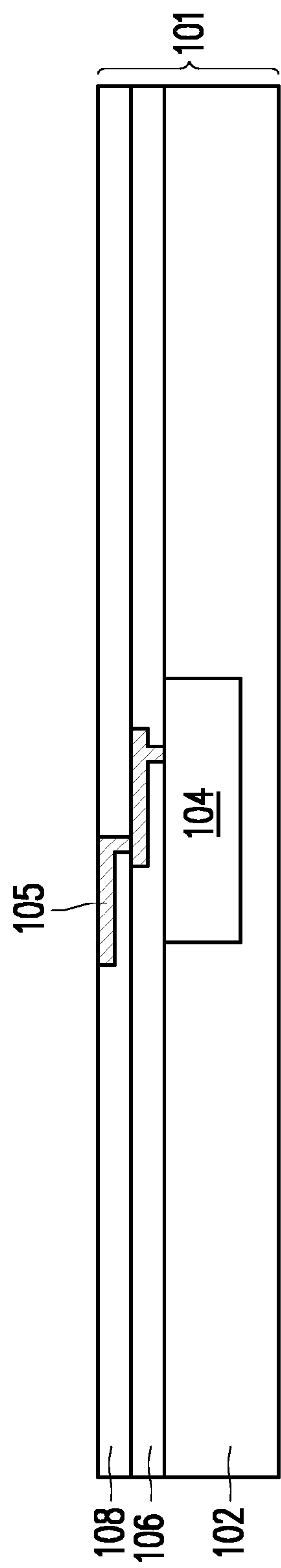

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a three-dimensional (3D) memory device includes a first tier having a plurality of first memory cells and a second tier having a plurality of second memory cells stacked over the first tier. The second memory cells are stacked on the first memory cells to allow for easy modification to increase the number of memory cells in the memory device, thereby improving the memory cell density. In addition, a dielectric material (e.g., isolation structure) is disposed between the first and second memory cells to reduce or eliminate the leakage current between two vertically neighboring memory cells, thereby improving the device performance.

FIG. 1 to FIG. 6A are cross-sectional views of a method of forming a 3D memory device 100 in accordance with a first embodiment. FIG. 6B is a plane view along a cross-section I-I' of FIG. 6A. The 3D memory device 100 is a 3D memory device with a ferroelectric material, and may be, but not limited thereto, a 3D NOR-type memory device.

Referring to FIG. 1, a plurality of electrical components 104, such as transistors, resistors, capacitors, inductors, diodes, or the like, are formed in a device region of a semiconductor substrate 102 in the front-end-of-line (FEOL) processing of semiconductor manufacturing. The semiconductor substrate 102 may be a bulk substrate, such as a silicon substrate, doped or undoped, or an active layer of a semiconductor-on-insulator (SOI) substrate. The semiconductor substrate 102 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The electrical components 104 may be formed in/on the semiconductor substrate 102 using any suitable formation method known or used in semiconductor manufacturing.

After the electrical components 104 are formed, an interconnect structure is formed over the semiconductor substrate 102 to connect the electrical components 104, so as to form functional circuits. The interconnect structure may include a plurality of dielectric layers (e.g., 106, 108) and electrically conductive features 105 (e.g., vias, metal lines) formed in the dielectric layers. In some embodiments, the interconnect structure is formed in the back-end-of-line (BEOL) processing of semiconductor manufacturing. Formation of the interconnect structure is known in the art, thus details are not repeated here. To avoid clutter and for ease of discussion, the semiconductor substrate 102, the electrical components 104, and the interconnect structure over the semiconductor substrate 102 are collectively referred to as a substrate 101 in the discussion hereinafter, and the details of the substrate 101 illustrated in FIG. 1 may be omitted in subsequent figures.

Figure 2:
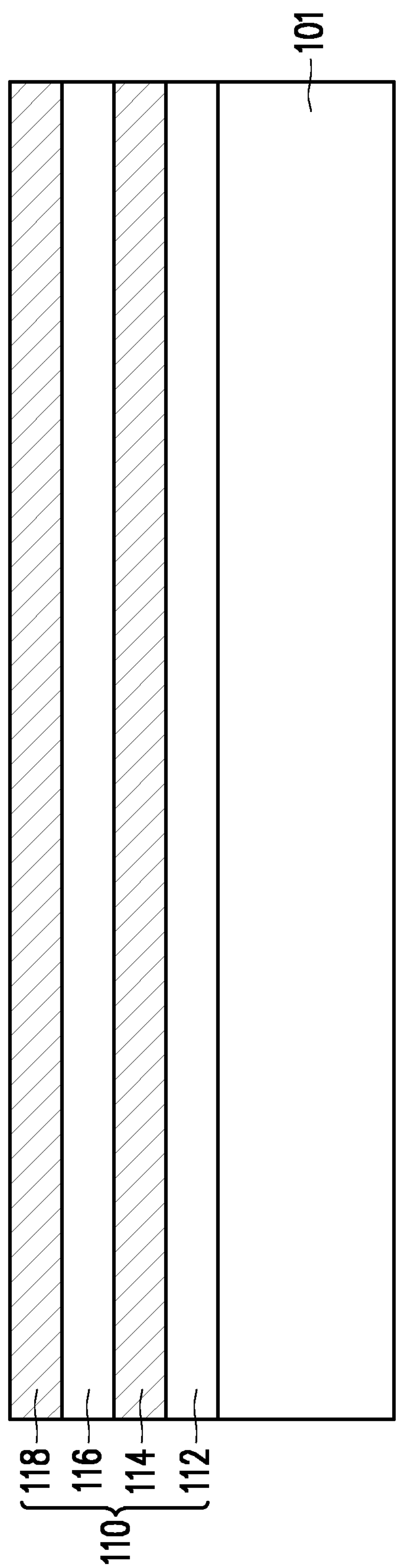

FIG. 2 to FIG. 6A illustrate additional processing steps in the BEOL processing to form the 3D memory device 100 in accordance with the first embodiment. Referring now to FIG. 2, a layer stack 110 is formed on the substrate 101. In detail, the layer stack 110 may include a dielectric layer 112, a conductive layer 114, a dielectric layer 116, and a conductive layer 118 formed successively on the substrate 101.

In some embodiments, the dielectric layers 112 and 116 may include a dielectric material, such as an organic dielectric material or an inorganic dielectric material. The organic dielectric material may be a polymer, such as polybenzoxazole (PBO), polyimide, benzocyclobutene (BCB), or the like. The inorganic dielectric material may include: a nitride such as silicon nitride or the like; an oxide such as silicon oxide; an oxynitride such as silicon oxynitride; phosphosilicate glass (PSG), borosilicate glass (BSG), boron-doped phosphosilicate glass (BPSG), or the like, or a combination thereof. The dielectric layer 112 may be formed, by spin coating, lamination, chemical vapor deposition (CVD), or the like. In some embodiments, the dielectric layers 112 and 116 have the same dielectric material, such as silicon oxide. However, the embodiments of the present disclosure are not limited thereto, in other embodiments, the dielectric layers 112 and 116 have different dielectric materials.

In some embodiments, the conductive layers 114 and 118 may include a conductive material, such as metal. For example, the conductive layers 114 and 118 may be formed of the same source/drain (S/D) material, such as W, Ru, or the like. In this case, the conductive layers 114 and 118 may also be referred to as a first source/drain metal layer 114 and a second source/drain metal layer 118, respectively.

Depending on the type (e.g., N-type or P-type) of device formed, the first source/drain metal layer 114 and the second source/drain metal layer 118 may be formed of an N-type metal or a P-type metal. In some embodiments, Sc, Ti, Cr, Ni, Al, or the like, is used as the N-type metal for forming the first source/drain metal layer 114 and the second source/drain metal layer 118. In some embodiments, Nb, Pd, Pt, Au, or the like, is used as the P-type metal for forming the first source/drain metal layer 114 and the second source/drain metal layer 118. The N-type or P-type metal layer may be formed of a suitable formation method such as CVD, physical vapor deposition (PVD), atomic layer deposition (ALD), or the like. In some alternative embodiments, the source/drain metal layers 114 and 118 have different metal materials.

Figure 3:
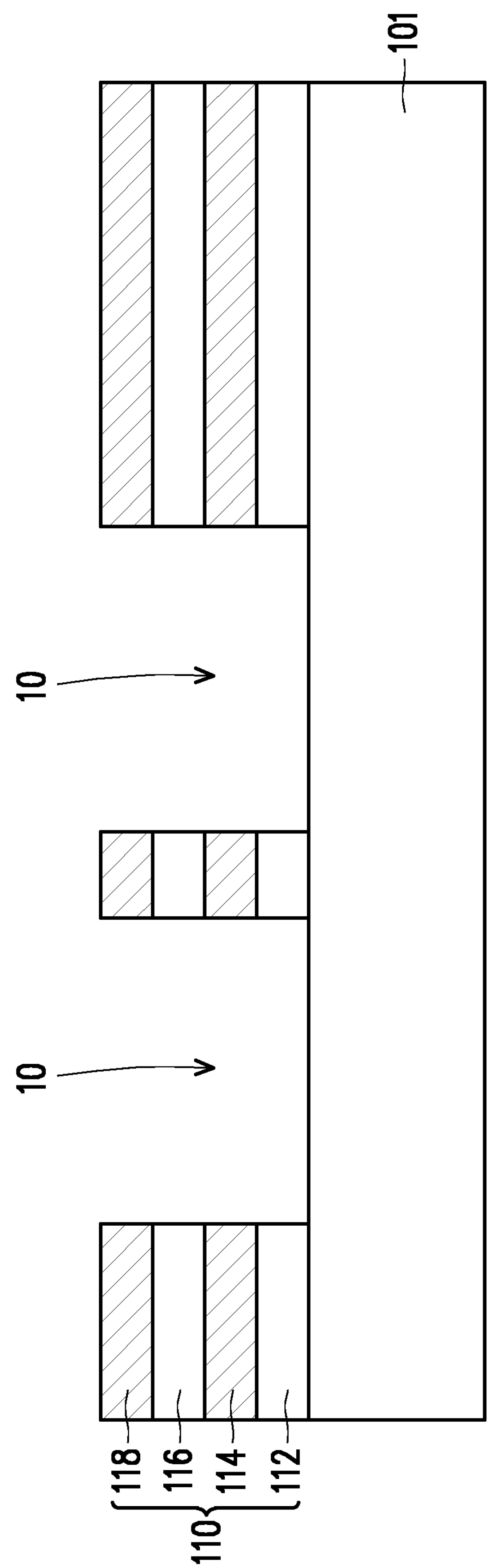

Next, referring to FIG. 3, a plurality of openings 10 are formed in the layer stack 110 to expose the substrate 101. That is, the openings 10 penetrate through the layer stack 110 and the substrate 101 is exposed at the bottoms of the openings 10. In addition, the openings 10 expose sidewalls of the dielectric layers 112, 116 and sidewalls of the conductive layers 114, 118. Note that in the discussion herein, a sidewall of the layer stack 110 includes the corresponding sidewalls of all the constituent layers (e.g., 112, 114, 116, and 118) of that layer stack. For example, a sidewall of the layer stack 110 exposed by the opening 10 includes the sidewalls of the dielectric layers 112, 116, and the sidewalls of the conductive layers 114, 118 that are exposed by the opening 10.

In some embodiments, the openings 10 are formed by an anisotropic etching process, such as a plasma etching process. A mask pattern, such as a patterned photoresist, may be formed on the layer stack 110. The anisotropic etching process may then be performed by using the mask pattern as an etching mask to form the openings 10. After the anisotropic etching process is finished, the mask pattern (e.g., patterned photoresist) may be removed by a suitable removal process, such as ashing or stripping.

Figure 4:
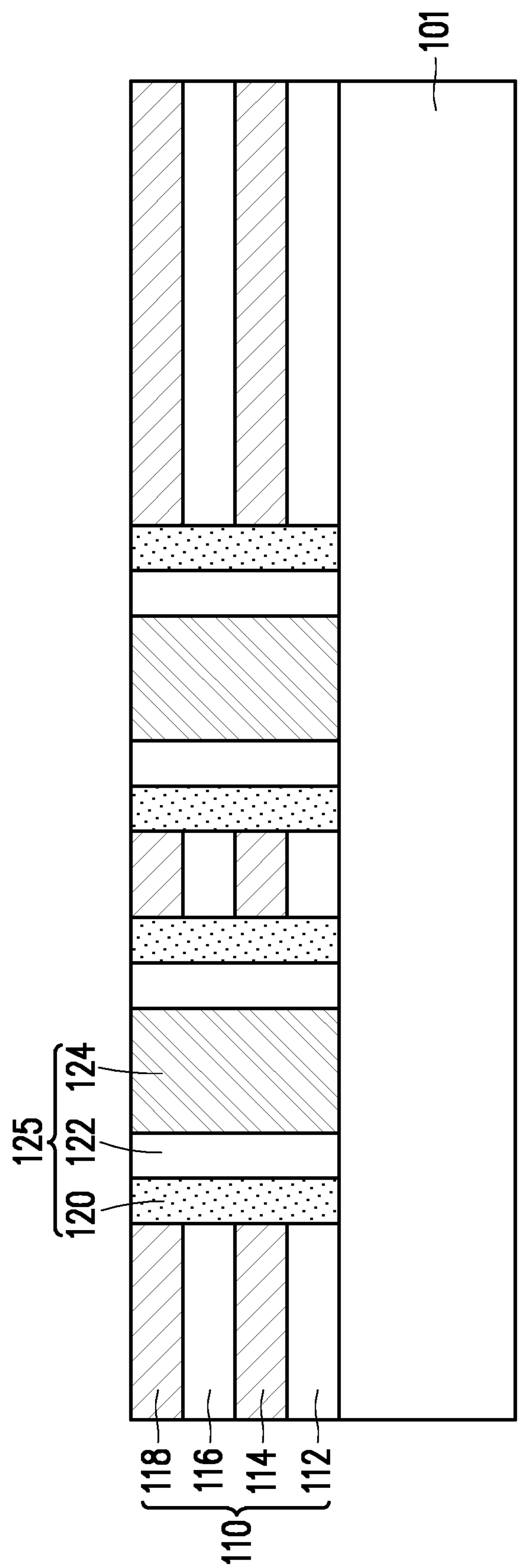

Referring to FIG. 4, a channel layer 120 is first formed to cover the sidewalls of the openings 10. In some embodiments, the channel layer 120 is formed by depositing a channel material that conformally covers the bottoms and sidewalls of the openings 10, and further cover the upper surface of the conductive layer 118; and then performing an anisotropic etching process to remove the channel material on the bottoms of the openings 10 and on the upper surface of the conductive layer 118. In this case, the channel layer 120 may have a rounded or curved top surface adjacent to the conductive layer 118. In some embodiments, the channel layer 120 may have a flat top surface, as shown in FIG. 4.

In some embodiments, the channel layer 120 may include a metal oxide, such as indium gallium zinc oxide (IGZO), formed by a suitable formation method, such as PVD, CVD, ALD or the like. Other suitable materials for the channel layer 120 include zinc oxide (ZnO), indium tungsten oxide (IWO), tungsten oxide (WO), tantalum oxide (TaO), and molybdenum oxide (MoO). In an example embodiment, the dielectric layers 112 and 116 are formed of $SiO_2$, the conductive layers 114 and 118 are formed of tungsten (W), and the channel layer 120 is formed of IGZO.

Next, as shown in FIG. 4, a ferroelectric layer 122 is formed in the openings 10 to cover the channel layer 120. The ferroelectric layer 122 may include a ferroelectric material, such as HZO, HSO, HfSiO, HfLaO, $HfO_2$, $HfZrO_2$, $ZrO_2$, or $HfO_2$ doped by La, Y, Si, or Ge, and may be formed by PVD, CVD, ALD, or the like. In some embodiments, the ferroelectric layer 122 is formed by depositing a ferroelectric material that conformally covers the channel layer 120, the bottoms of the openings 10, and further covers the upper surface of the conductive layer 118; and then performing an anisotropic etching process to remove the ferroelectric material on the bottoms of the openings 10 and on the upper surface of the conductive layer 118. In this case, the ferroelectric layer 122 may have a rounded or curved top surface.

Thereafter, as shown in FIG. 4, a conductive material is formed to fill in the openings 10. The conductive material may include copper, tungsten, cobalt, aluminum, tungsten nitride, rhuthenium, silver, gold, rhodium, molybdenum, nickel, cadmium, zinc, alloys thereof, combinations thereof, and the like, and may be formed by a suitable deposition method such as CVD, PVD, ALD, plating, or the like. After the conductive material is formed, a planarization process, such as chemical mechanical planarization (CMP) process, may be performed to remove excessive portions of the conductive material from the upper surface of the conductive layer 118. In this case, the remaining portions of the conductive material in the openings 10 forms conductive pillars 124 (also referred to as gate electrodes 124).

After forming the conductive pillars 124, as shown in FIG. 4, a plurality of gate structures 125 formed in the openings 10 are accomplished. In detail, each gate structure 125 may include the channel layer 120, the ferroelectric layer 122, and the conductive pillar 124. The ferroelectric layer 122 wraps the conductive pillar 124. The ferroelectric layer 122 is sandwiched between and in physical contact with the channel layer 120 and conductive pillar 124. The channel layer 120 is disposed between the layer stack 110 and the ferroelectric layer 122. That is, the channel layer 120 (or the gate structures 125) is surrounded by the dielectric layers 112, 116, and the conductive layers 114, 118.

Figure 5:
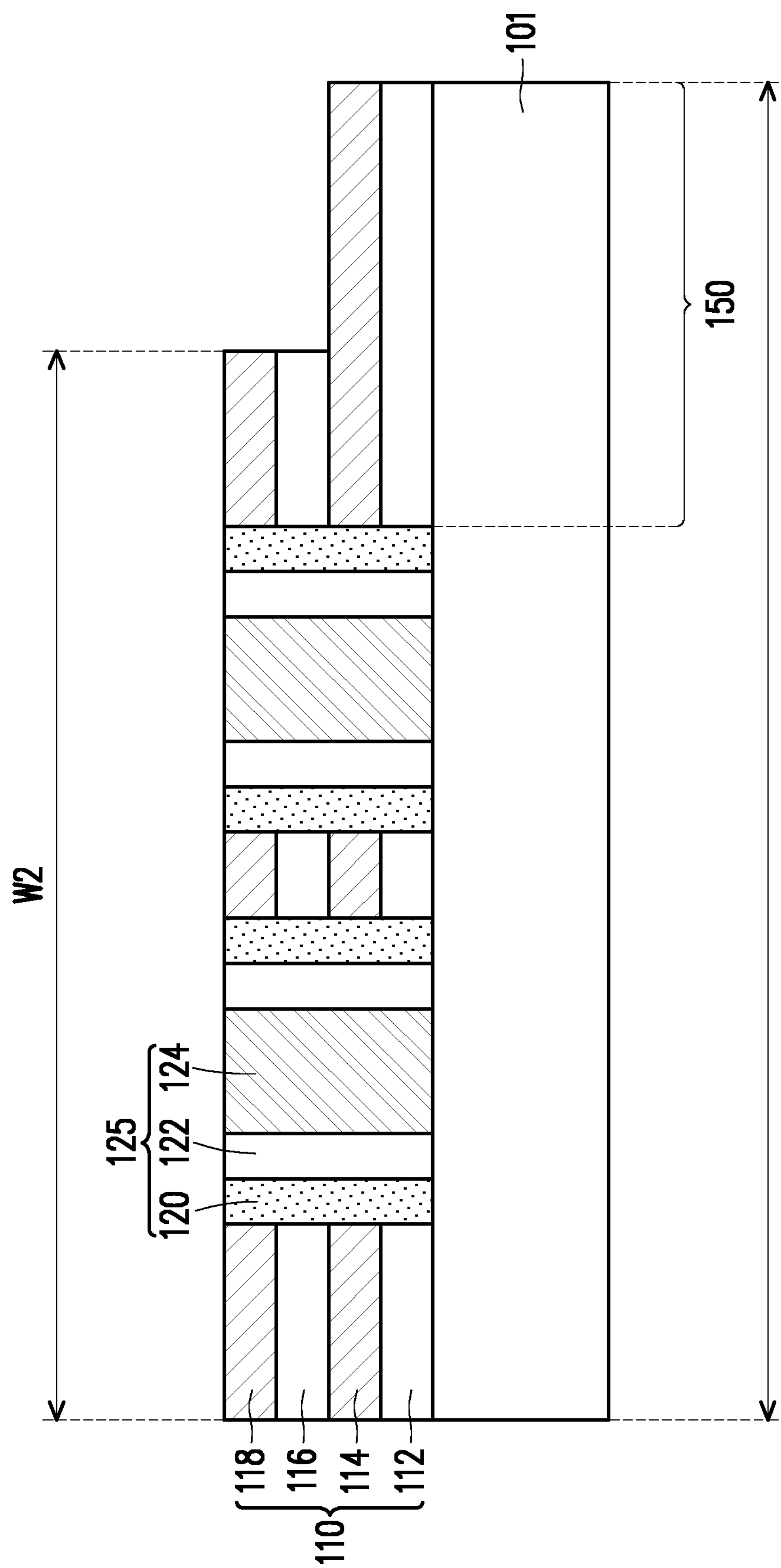

Referring to FIG. 5, a portion of the conductive layer 118 and a portion of the dielectric layer 116 are removed by one or more etching processes (e.g., anisotropic etching processes) using an etching mask, so as to form a staircase shaped region 150. The etching time for each of the etching processes may be adjusted to achieve different amount (e.g., depth) of etching.

As shown in FIG. 5, after the staircase shaped region 150 is formed, a portion of the upper surface of the conductive layer 114 is exposed. In the example of FIG. 5, the dielectric layer 112 and the conductive layer 114 has a same width W1. The dielectric layer 116 and the conductive layer 118 has a same width W2 less than the width W1. That is, the conductive layer 118 in the staircase shaped region 150 has a sidewall aligned along a same line with a respective sidewall of the dielectric layer 116. In addition, respective widths of the conductive layers 114 and 118 increase in a direction toward the substrate 101, so that the upper conductive layer 118 has a width less than a width of the lower conductive layer 114. The staircase shaped region 150 facilitates access to the conductive layer 114 for the subsequently formed contacts 128 (see FIG. 6A).

Figure 6A:
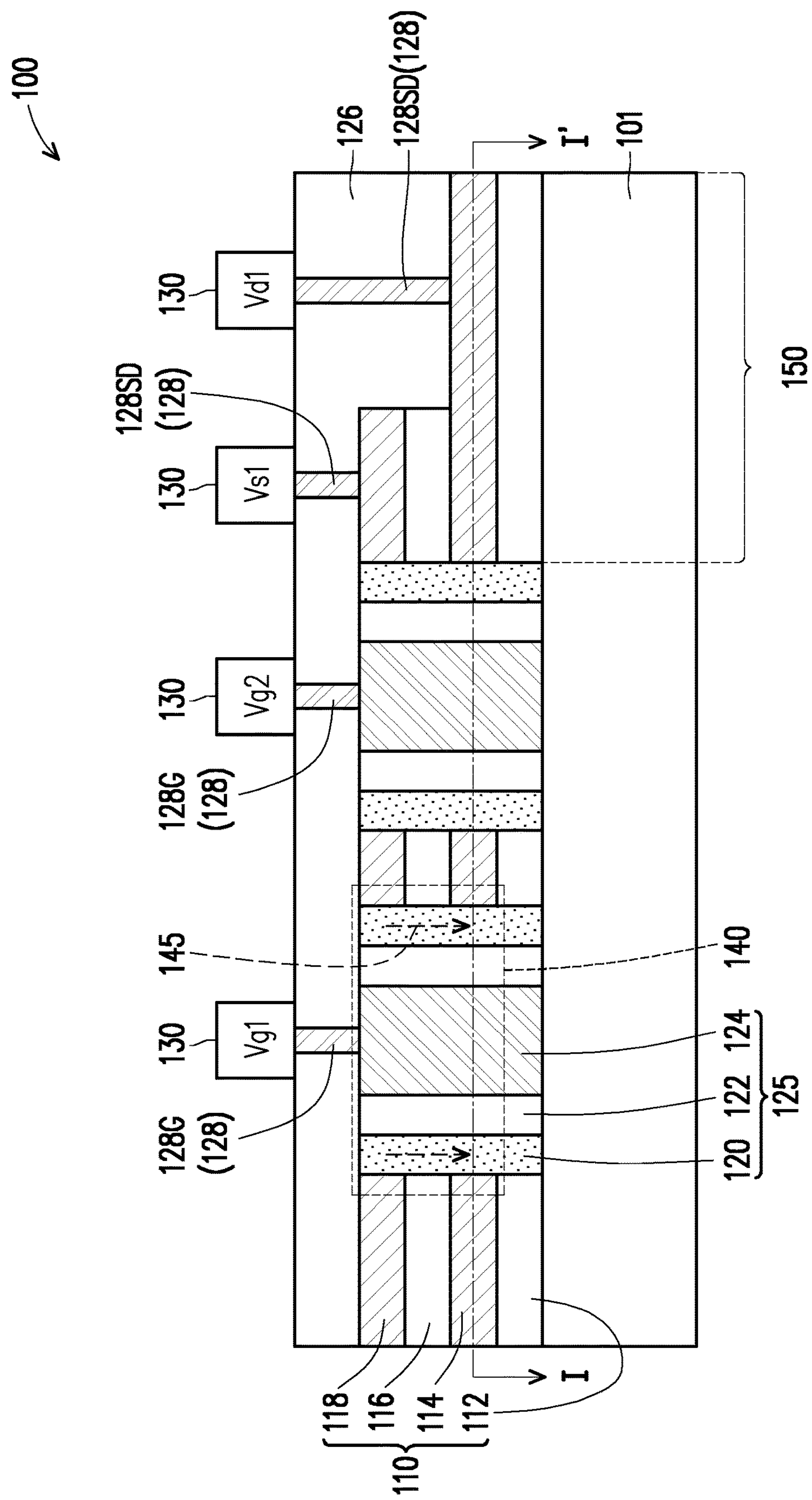

Referring to FIG. 6A, a dielectric material 126 is formed over the structure of FIG. 5. A plurality of contacts 128 (also referred to as contact plugs) are formed in the dielectric material 126 and electrically coupled to the conductive pillars 124 or the conductive layers 114 and 118. In some embodiments, the contacts 128 electrically coupled to the conductive pillars 124 are also referred to as gate contacts 128G, and the contacts 128 electrically coupled to the conductive layers 114 and 118 are also referred to as source/drain contacts 128SD. In some embodiments, a length of the source/drain contact 128SD contacting the conductive layer 114 is greater than a length of the source/drain contact 128SD contacting the conductive layer 118.

The dielectric material 126 may include an organic dielectric material or an inorganic dielectric material. The organic dielectric material may be a polymer, such as polybenzoxazole (PBO), polyimide, benzocyclobutene (BCB), or the like. The inorganic dielectric material may include: a nitride such as silicon nitride or the like; an oxide such as silicon oxide; an oxynitride such as silicon oxynitride; phosphosilicate glass (PSG), borosilicate glass (BSG), boron-doped phosphosilicate glass (BPSG), or the like, or a combination thereof. The dielectric material 126 may be formed, by spin coating, lamination, CVD, or the like. In addition, the contacts 128 may be formed by forming openings in the dielectric material 126 to expose an underlying conductive feature (e.g., 124, 114, or 118), and filling the opening with a conductive material, such as copper, tungsten, cobalt, gold, silver, alloys thereof, combinations thereof, or the like.

Next, a plurality of connectors 130 (also referred to as conductive connectors or conductive bumps) are formed over and electrically coupled to the contacts 128. The connectors 130 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 130 may include a conductive material such as solder, copper, aluminum, gold, nickel, silver, palladium, tin, the like, or a combination thereof. In some embodiments, the connectors 130 include a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. The connectors 130 may form a grid, such as a ball grid array (BGA). In some embodiments, a reflow process may be performed, giving the connectors 130 a shape of a partial sphere in some embodiments. Alternatively, the connectors 130 may comprise other shapes. The connectors 130 may also include non-spherical conductive connectors.

In some embodiments, the connectors 130 include metal features (such as copper pillars or copper lines) formed by a sputtering, printing, electro plating, electroless plating, CVD, or the like, with or without a solder material thereon. The metal pillars may be solder free and have substantially vertical sidewalls or tapered sidewalls.

Figure 6B:
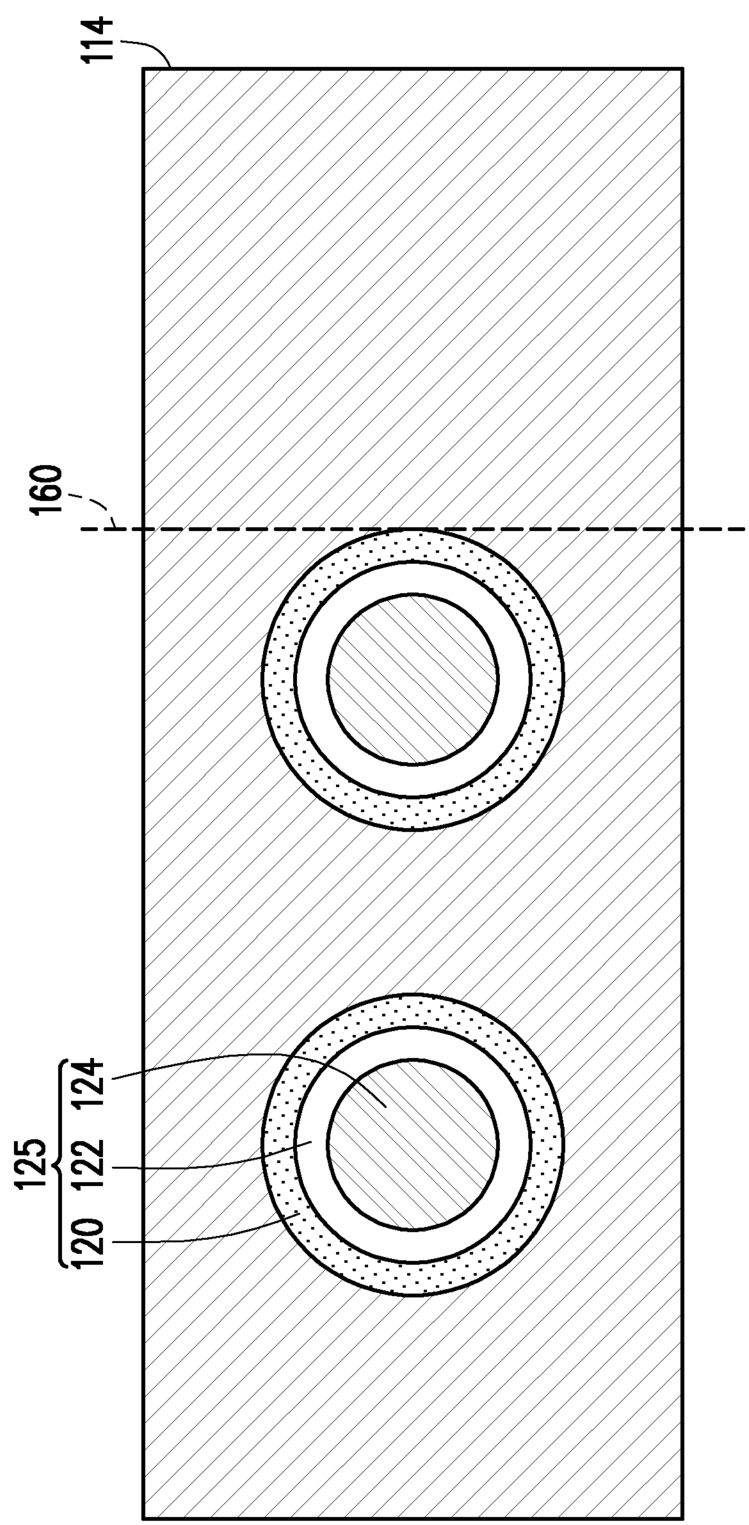
FIG. 6B is a plane view along a cross-section I-I' of FIG. 6A.

FIG. 6B illustrates the 3D memory device of FIG. 6A, but along cross-section I-I' in FIG. 6A. In the cross-sectional view of FIG. 6B, the ferroelectric layer 122 wraps (e.g., encircles) the conductive pillar 124, and the channel layer 120 wraps the ferroelectric layer 122. The region to the right of the dashed line 160 corresponds to the staircase shaped region 150 of the 3D memory device 100.

As show in FIG. 6A, the dashed box in FIG. 6A illustrates a memory cell 140 of the 3D memory device 100. The 3D memory device 100 includes a plurality of such memory cells. The memory cell 140 includes the gate structure 125 penetrating through the layer stack 110, and the conductive layers 114 and 118 (hereinafter called S/D layers 124). The gate structure 125 may include the conductive pillar 124 (hereinafter called gate electrode 124), the ferroelectric layer 122 wrapping the gate electrode 124, the channel layer 120, and the channel layer 120 between the layer stack 110 and the ferroelectric layer 122. Since the channel layer 120 is disposed between the S/D layers 114 and 118 of the layer stack 110, each of the memory cells 140 of the 3D memory device 100 is a transistor with the ferroelectric layer 122, in the illustrated embodiment. The dashed arrows 145 in FIG. 6A illustrate possible current flow directions in the channel layer 120 when the transistor of the memory cell is turned on.

In the example of FIG. 6A, two memory cells side by side are illustrated. To avoid clutter, besides the memory cell 140, the other memory cells are not marked by dashed boxes. The memory cell 140 can be programmed (e.g., written and/or read) through connectors 130 that are electrically coupled to the gate and the S/D terminals of the transistor of the memory cell, e.g., the connectors 130 labeled Vg1, Vs1 and Vd1. Similarly, the connectors 130 labeled Vg2, Vs1, Vd1 can be used to program another memory cell disposed aside the memory cell 140.

To perform a write operation on a particular memory cell, e.g., the memory cell 140, a write voltage is applied across a portion of the ferroelectric layer 122 corresponding to the memory cell 140. The write voltage may be applied, for example, by applying a first voltage to the gate electrode 124 of the memory cell 140 (through the connector 130 labeled Vg1), and applying a second voltage to the S/D layers 114 and 118 (through the connectors 130 labeled Vs1 or Vd1). The voltage difference between the first voltage and the second voltage sets the polarization direction of the ferroelectric layer 122. Depending on the polarization direction of the ferroelectric layer 122, the threshold voltage VT of the corresponding transistor of the memory cell 140 can be switched from a low threshold voltage $V_L$ to a high threshold voltage $V_H$, or vice versa. The threshold voltage value ($V_L$ or $V_H$) of the transistor can be used to indicate a bit of "0" or a "1" stored in the memory cell.

To perform a read operation on the memory cell 140, a read voltage, which is a voltage between the low threshold voltage $V_L$ and the high threshold voltage $V_H$, is applied to the transistor, e.g., between the gate electrode 124 and the second S/D layer 118. Depending on the polarization direction of the ferroelectric layer 122 (or the threshold voltage of the transistor), the transistor of the memory cells 140 may or may not be turned on. As a result, when a voltage is applied, e.g., at the first S/D layer 114, an electrical current may or may not flow between the first S/D layer 114 and the second S/D layer 118 through the channel layer 120. The electrical current may thus be detected to determine the digital bit stored in the memory cell.

It should be noted that, in the present embodiment, the gate structure 125 is vertically disposed on the substrate 101 and penetrates through the layer stack 110, so that the S/D layers 114 and 118 wrap or surround the gate structure 125, thereby forming a similar gate-all-around (GAA) memory device. In this case, the memory cells are surrounded by the S/D layers 114 and 118 disposed at the same level, so that the memory cells share the same S/D voltage (Vs1 or Vd1), thereby simplifying the routing layout of the S/D layers. Further, compared with the planar memory device, the memory device of the present embodiment is able to effectively utilize the area of the chip in the horizontal direction and increase the integration density of the memory device, thereby facilitating the miniaturization of the chip.

As another example, while the disclosed embodiments illustrate the said process of forming the S/D layers 114 and 118, these embodiments are illustrative and not limiting. In alternative embodiments, the S/D layers 114 and 118 may be formed by a replacement process. Specifically, the layer stack including a first oxide layer, a first nitride layer, a second oxide layer, and a second nitride layer stacked in order is formed on the substrate 101. The openings 10 are formed are formed in the layer stack to expose the substrate 101. The gate structures 125 are respectively formed in the openings 10. One or more slits are formed aside the openings 10 and penetrate through the layer stack. The first and second nitride layers are then replaced by the source/drain (S/D) material, such as W, Ru, or the like. In some embodiments, the replacement process includes following steps: removing the first and second nitride layers through an etching process, such as a wet etching process, so as to form a plurality gaps between the first and second oxide layers; and the S/D material is filled in the gaps between the first and second oxide layers, so as to form the S/D layers 114 and 118. Before the replacement process, the portions of the S/D layers 114 and 118 are removed to form the staircase shaped region 150.

Figure 7A:
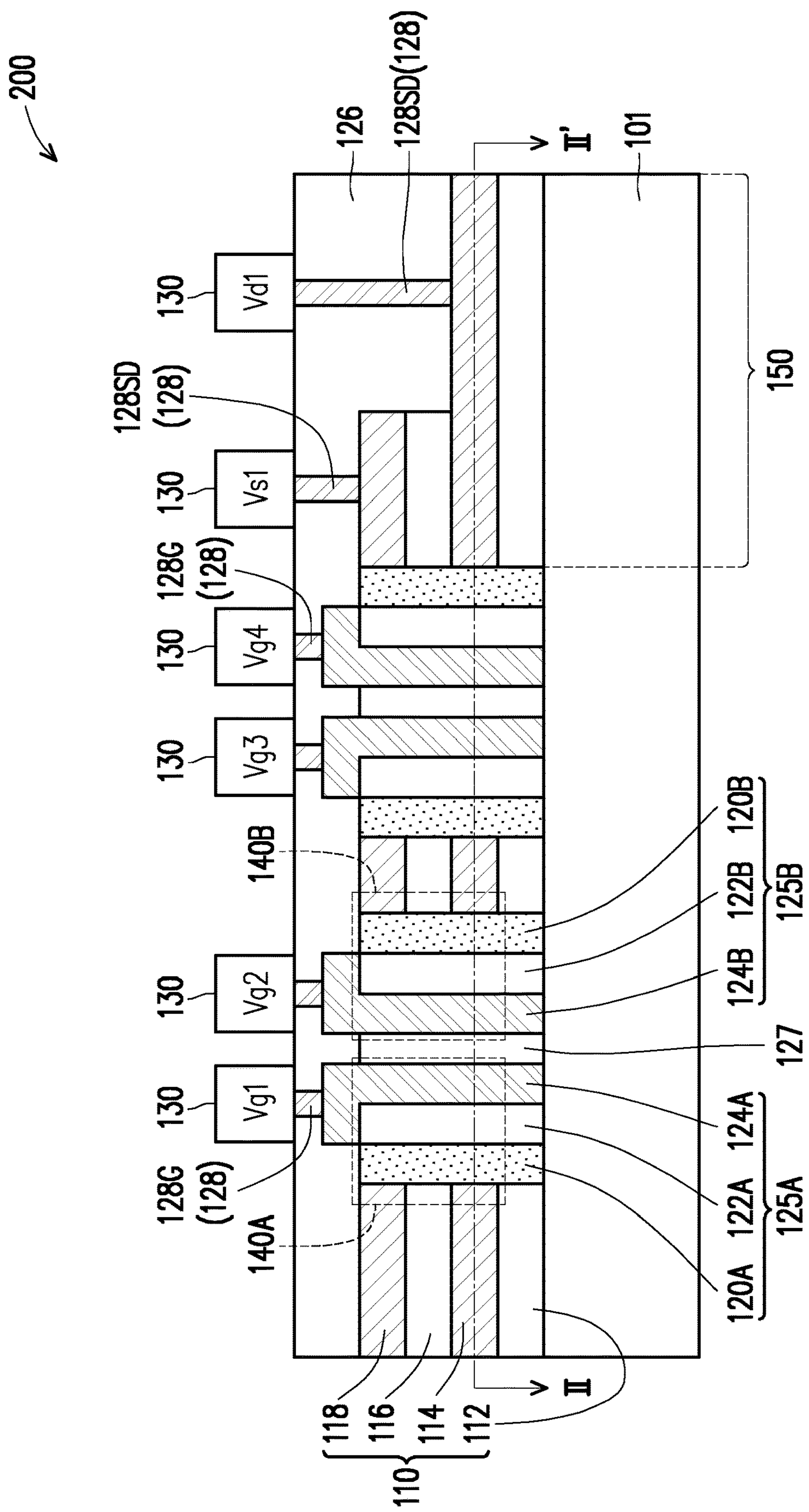
FIG. 7A is a cross-sectional view of a 3D memory device in accordance with a second embodiment.
Figure 7B:
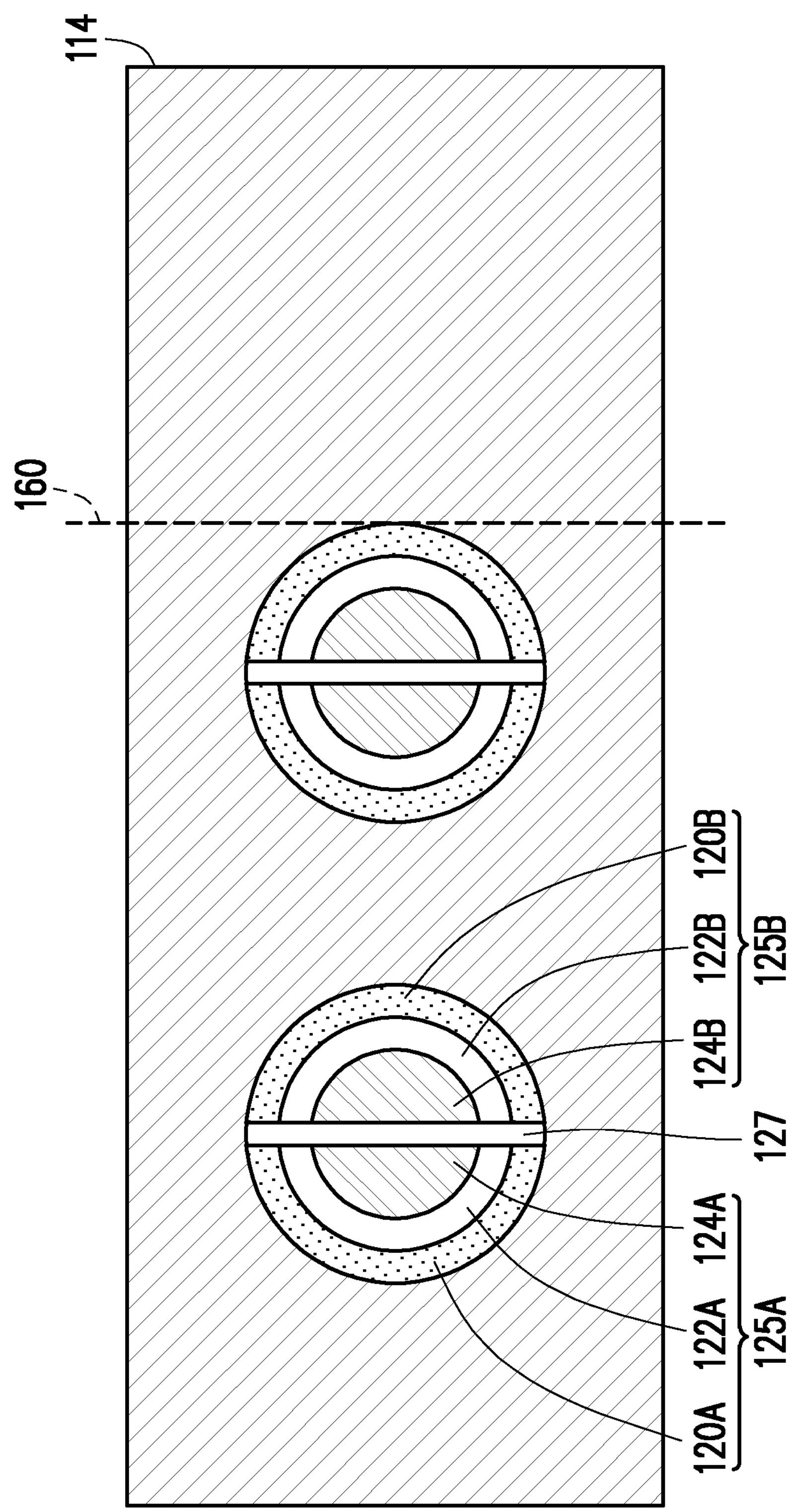
FIG. 7B is a plane view along a cross-section II-II' of FIG. 7A.

FIG. 7A is a cross-sectional view of a 3D memory device 300 in accordance with a second embodiment. FIG. 7B is a plane view along a cross-section II-II' of FIG. 7A. The 3D memory device 200 is similar to the 3D memory device 100 of FIG. 6A, but with additional processing to increase (e.g., double) the memory cell density.

In some embodiments, to form the 3D memory device 200, the processing steps in FIG. 1 to FIG. 5 for the 3D memory device 100 are followed. Next, a slot shaped opening is formed in each of the conductive pillar 124. The slot shaped opening extends vertically from an upper surface of the conductive pillar 124 distal from the substrate 101 to a lower surface of the conductive pillar 124 facing the substrate 101. In a top view, the slot shaped opening extends along, e.g., a diameter of the conductive pillar 124 and separates the conductive pillar 124 into two separate gate pillars 124A and 124B (hereinafter called gate electrodes). The slot shaped opening also extends into the ferroelectric layer 122 and the channel layer 120, and cuts the ferroelectric layer 122 into two separate segments 122A and 122B and further cuts the channel layer 120 into two separate segments 120A and 120B, in the illustrated example of FIG. 7B. That is, the slot shaped opening cuts the gate structure 125 into two separate segments 125A and 125B.

In addition, as shown in FIG. 7A, each of the gate electrodes 124A and 124B has a top portion that extends along an upper surface of the ferroelectric layer 122, and therefore, the conductive pillar 124A (or 124B) has an L-shaped cross-section. The top portion of the gate electrodes 124A and 124B allows for more flexibility in choosing the locations of the connectors 130 coupled to the gate electrodes. In some alternative embodiments, the top portions of the gate electrodes 124A and 124B may be omitted if the width of the gate electrodes 124A and 124B embedded in the stack layer 110 is large enough to be coupled to the connectors 130.

Next, as illustrated in FIG. 7A, a dielectric material 127, such as silicon oxide, silicon nitride, or the like, is formed to fill the slot shaped openings. The dielectric material 127 may be referred to as an isolation structure to electrically isolates the gate electrodes 124A and 124B. Thereafter, the dielectric material 126 is formed over the conductive layer 118, and the contacts 128 are formed in the dielectric material 126 to electrically couple to respective underlying conductive features (e.g., gate electrodes 124A/124B, or S/D layers 114/118). Next, the connectors 130 are formed over and electrically coupled to the respective contacts 128. FIG. 7B shows the cross-sectional view of the 3D memory device 200 of FIG. 7A, but along cross-section II-II' in FIG. 7A. In some embodiments, the filling of the slot shaped openings and the formation of the dielectric material 126 are performed together in a same deposition process, and therefore, the dielectric material 127 filling the slot shaped openings is the same as the dielectric material 126 over the conductive layer 118. However, the embodiments of the present disclosure are not limited thereto, in other embodiments, the dielectric material 127 and the dielectric material 126 may be formed in different deposition processes, and may have different dielectric materials.

Due to the dielectric material 127 separating the conductive pillar 124 into two separate, independently controlled (e.g., having different gate voltages) gate electrodes 124A and 124B, the number of memory cells in the 3D memory device 200 is double that of the 3D memory device 100. The dashed boxes 140A and 140B in FIG. 7A show two memory cells formed in a region that corresponds to the memory cell 140 in FIG. 6A. As shown in FIG. 7A, each of the memory cells 140A/140B is half the size of the memory cell 140 in FIG. 6A. In the example of FIG. 7A, there are four connectors 130 (labeled Vg1, Vg2, Vg3, and Vg4), each of which is electrically coupled to a gate of a transistor of a memory cell. In addition, there are two connectors 130, labeled Vs1 and Vd1, where the two connectors 130 are coupled to the S/D layers 114 and 118 of a transistor of a memory cell. Therefore, the example of FIG. 7A illustrates four memory cells, where each of the memory cells can be programmed by applying appropriate voltages to the gate and S/D terminals of the transistor of each memory cell.

Figure 8:
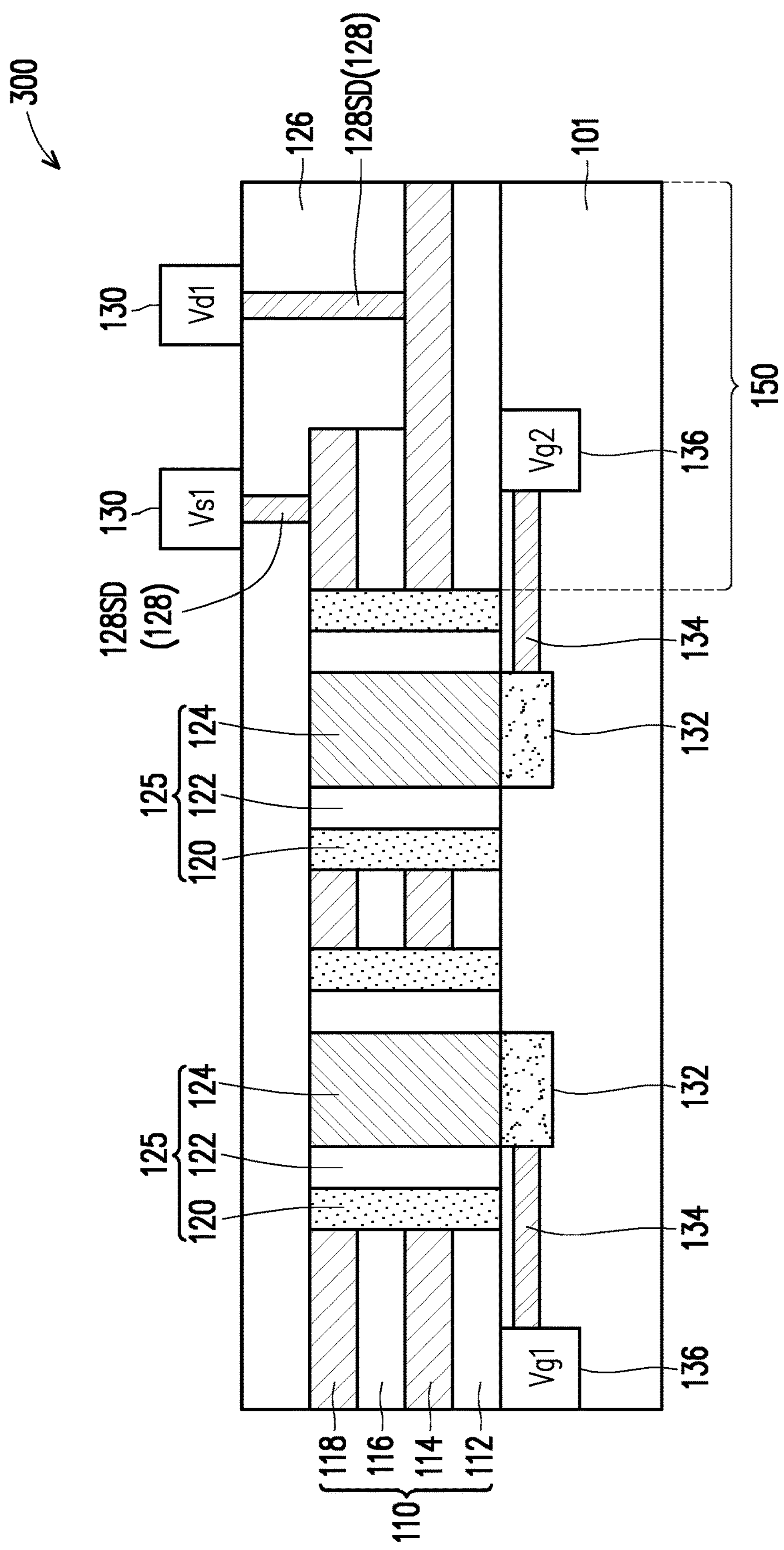
FIG. 8 is a cross-sectional view of a 3D memory device in accordance with a third embodiment.

FIG. 8 is a cross-sectional view of a 3D memory device 300 in accordance with a third embodiment.

The 3D memory device 300 is similar to the 3D memory device 100 of FIG. 6A, but the connectors 130 labeled Vg1 and Vg2 in FIG. 6A are replaced by electrically conductive features 136 in the substrate 101. The electrically conductive features 136 may be formed as part of the interconnect structures of the substrate 101. In addition, electrically conductive regions 132 are formed in the substrate 101 under (e.g., directly under and physically contacts) and electrically coupled to the gate electrodes 124. In some embodiments, the electrically conductive regions 132 are epitaxial regions comprising an epitaxially grown semiconductor material. In some embodiments, the electrically conductive regions 132 are doped regions, e.g., semiconductor regions doped with a N-type or P-type dopant. FIG. 8 also illustrates an electrical path 134, such as conductive line in the substrate 101, connecting the electrically conductive features 136 with respective electrically conductive regions 132. The electrical path 134 may be conductive lines in the interconnect structures of the substrate 101. The gate voltages of the 3D memory device 300 are applied to the gate electrodes 124 through the electrically conductive feature 136.

Figure 9:
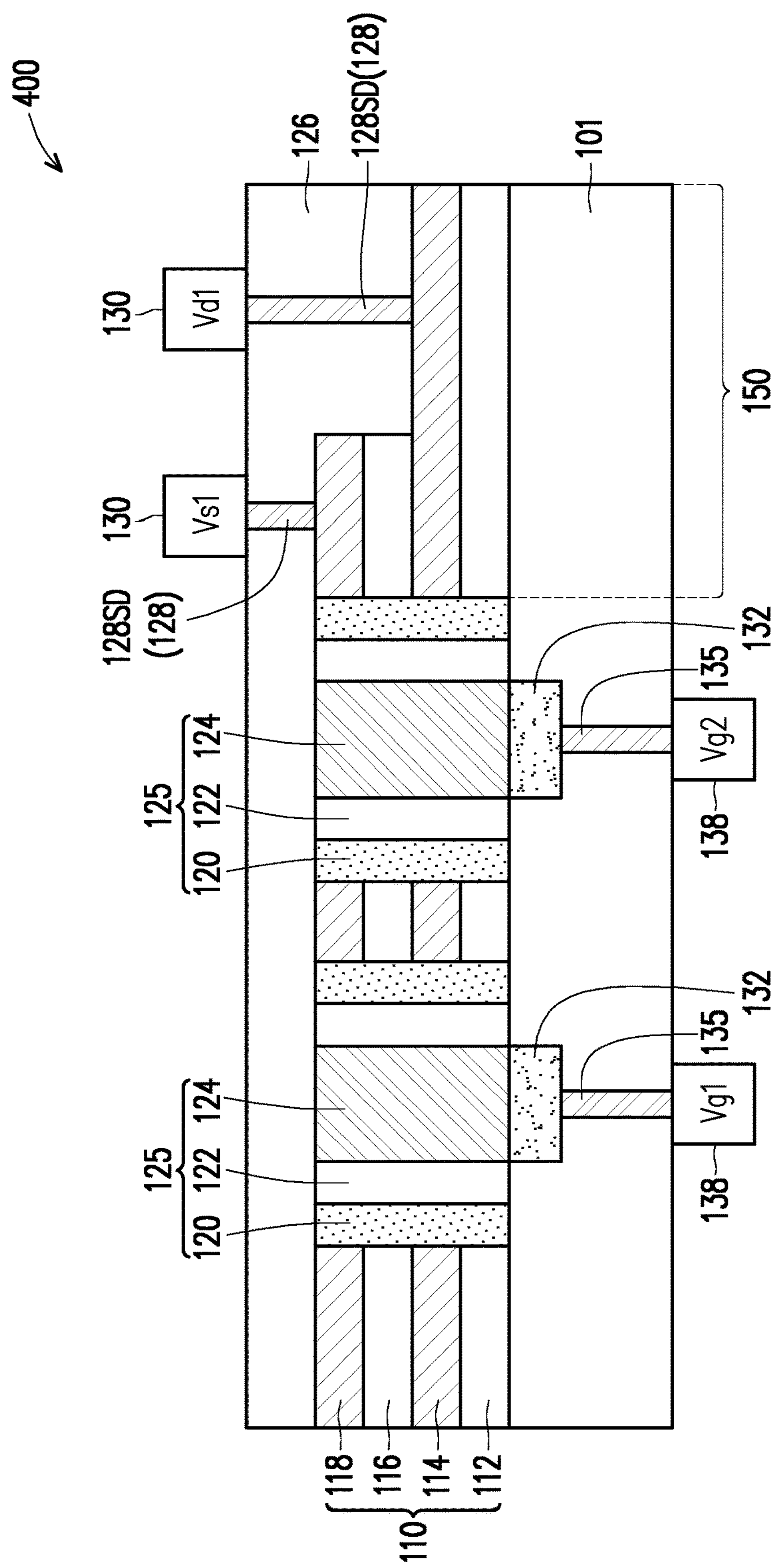
FIG. 9 is a cross-sectional view of a 3D memory device in accordance with a fourth embodiment.
Figure 10:
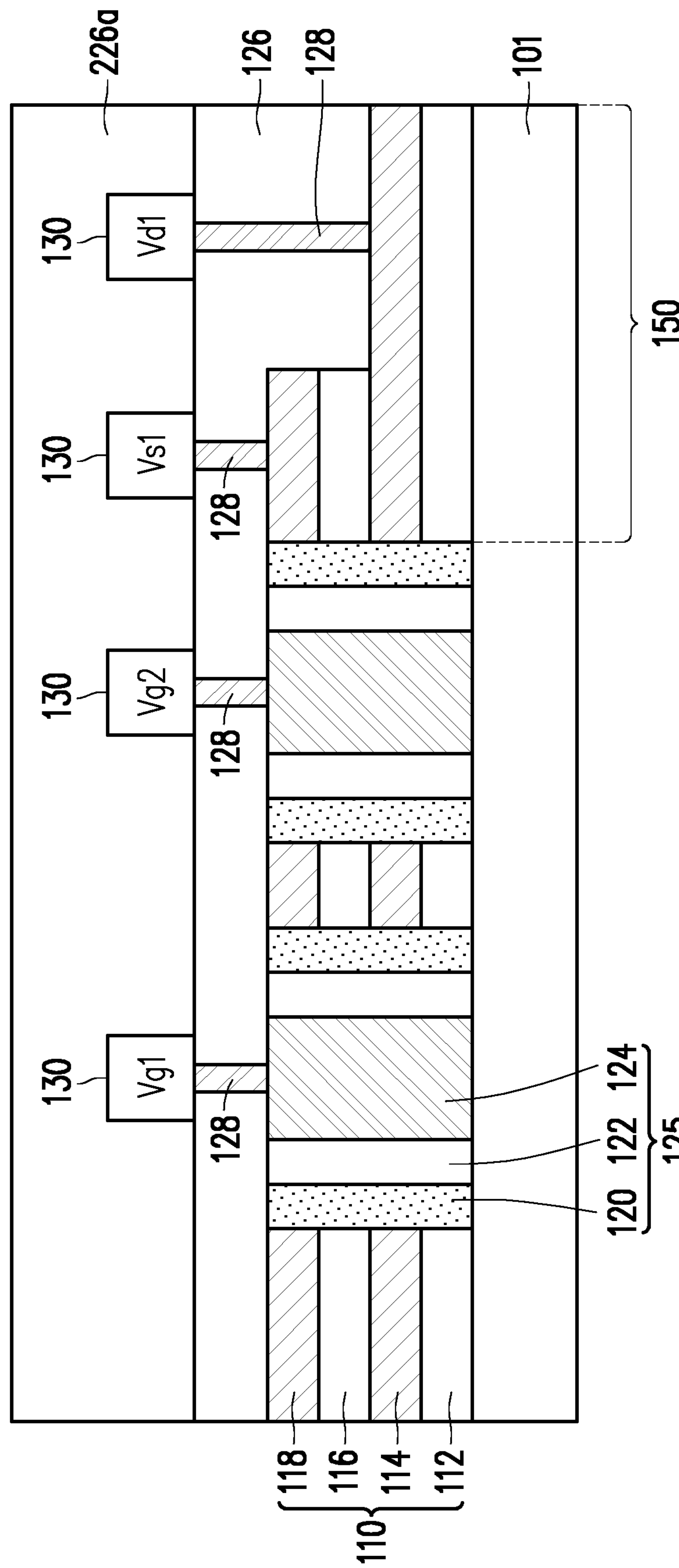
FIG. 10 to FIG. 16 are cross-sectional views of a method of forming a 3D memory device in accordance with a fifth embodiment.

FIG. 9 is a cross-sectional view of a 3D memory device 400 in accordance with a fourth embodiment.

The 3D memory device 400 is similar to the 3D memory device 300 of FIG. 8, but the electrically conductive regions 132 are electrically coupled to the connectors 138 at the bottom surface of the substrate 101 by another electrical path 135, such as through-substrate vias (TSVs). Therefore, the gate voltages of the 3D memory device 400 are applied at the connectors 138.

It should be noted that, in some embodiments, the gate voltages of the 3D memory device 300 or 400 may be applied from the interconnect structures of the substrate 101, thereby simplifying the routing layout of the gate electrode. In addition, the disclosed embodiments allow for easy modification to increase the number of memory cells in the memory device, thus improving the memory cell density. The disclosed formation methods for the 3D memory devices can be easily integrated into existing BEOL process, thereby allowing integration of memory devices in various semiconductor devices at low production cost.

FIG. 10 to FIG. 16 are cross-sectional views of a method of forming a 3D memory device 500 in accordance with a fifth embodiment. The 3D memory device 500 is similar to the 3D memory device 100 of FIG. 6A, but with additional processing to increase (e.g., double) the memory cell density.

In some embodiments, to form the 3D memory device 500, the processing steps in FIG. 1 to FIG. 6A for the 3D memory device 100 are followed. Next, referring to FIG. 10, a dielectric material 226*a* is formed over the structure of FIG. 6A. In some embodiments, the dielectric material 226*a* may include an organic dielectric material or an inorganic dielectric material. The organic dielectric material may be a polymer, such as polybenzoxazole (PBO), polyimide, benzocyclobutene (BCB), or the like. The inorganic dielectric material may include: a nitride such as silicon nitride or the like; an oxide such as silicon oxide; an oxynitride such as silicon oxynitride; phosphosilicate glass (PSG), borosilicate glass (BSG), boron-doped phosphosilicate glass (BPSG), or the like, or a combination thereof. The dielectric material 226*a* may be formed, by spin coating, lamination, CVD, or the like.

Figure 11:
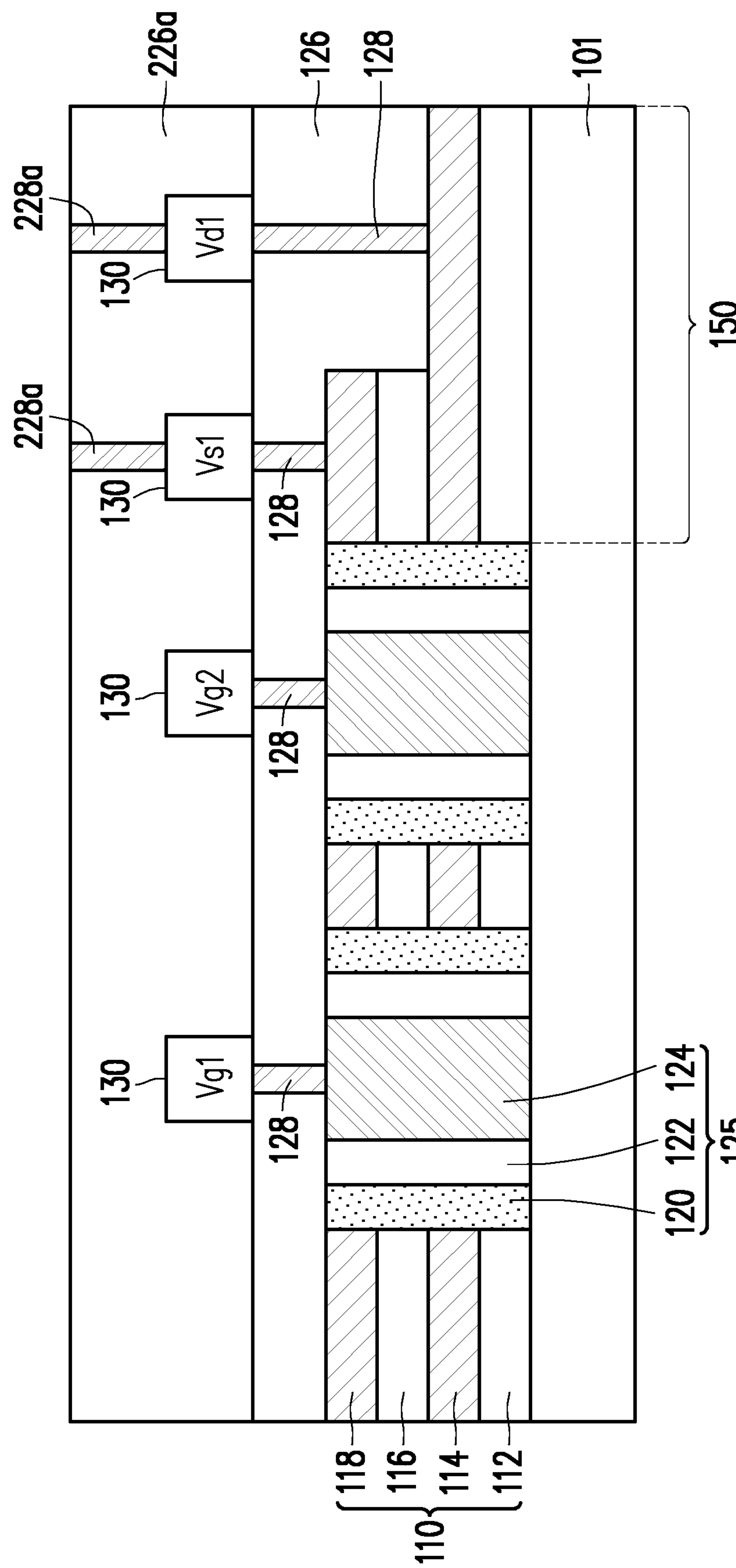

Referring to FIG. 11, a plurality of contacts 228*a* (also referred to as contact plugs) are formed in the dielectric material 226*a* and electrically coupled to the connectors 130 labeled Vs1 and Vd1. In some embodiments, the contacts 228*a* may be formed by forming openings in the dielectric material 226*a* to expose the underlying connectors 130 labeled Vs1 and Vd1, and filling the openings with a conductive material, such as copper, tungsten, cobalt, gold, silver, alloys thereof, combinations thereof, or the like. After the conductive material is formed, a planarization process, such as CMP process, may be performed to remove excessive portions of the conductive material from the upper surface of the dielectric material 226*a*.

Figure 12:
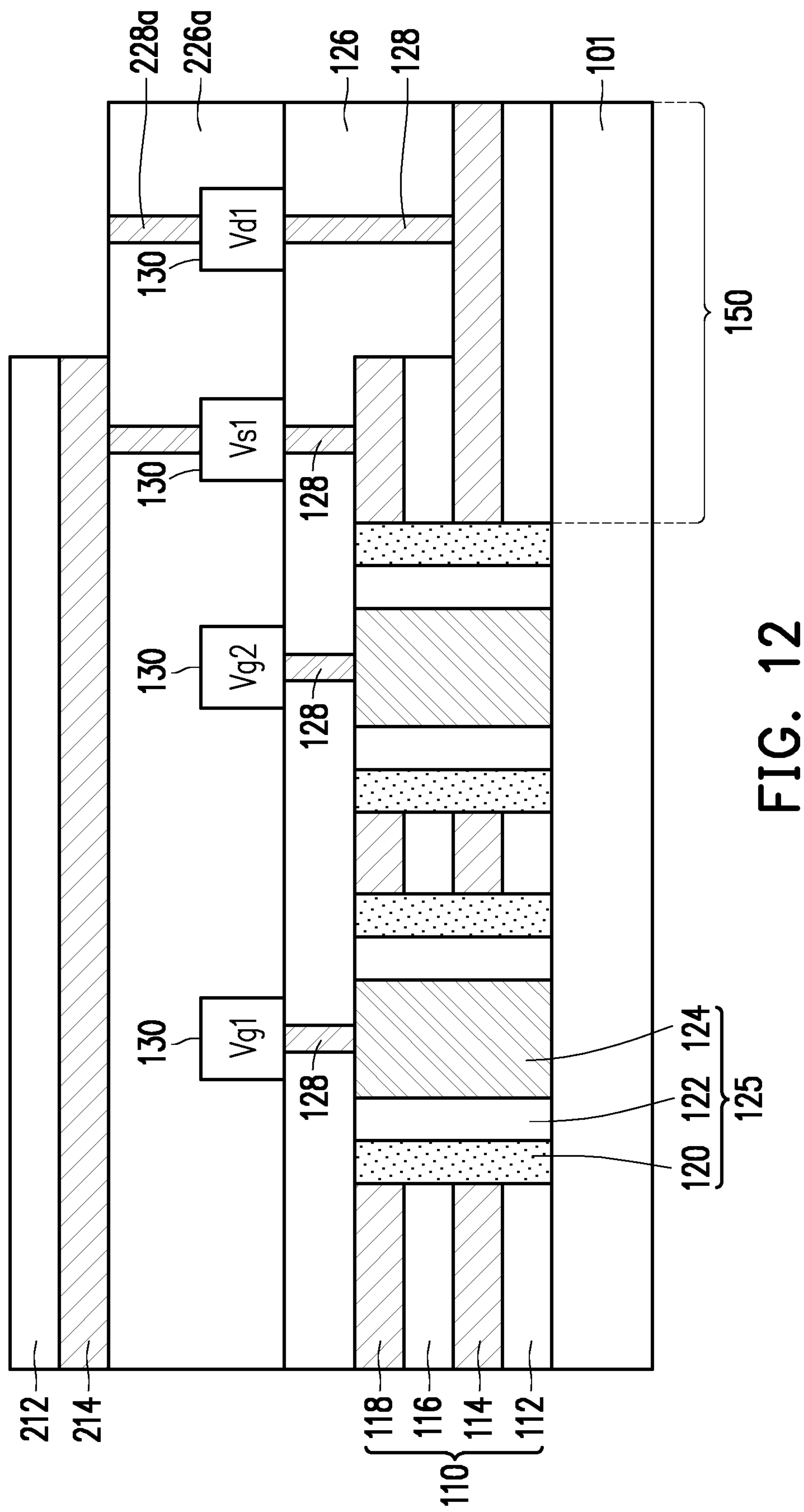

Referring to FIG. 12, a conductive layer 214 and a dielectric layer 212 are successively formed on the dielectric material 226*a*. The conductive layer 214 and the dielectric layer 212 are then patterned to expose the top surface of the contact 228*a* labeled Vd1 in the staircase shaped region 150, while the contact 228*a* labeled Vs1 are covered by the conductive layer 214 and the dielectric layer 212. The structure, material, and function of the conductive layer 214 and/or the dielectric layer 212 are similar to those of the conductive layer 114 and/or the dielectric layer 112 and have been described in the above embodiment, thus the details are omitted herein.

Figure 13:
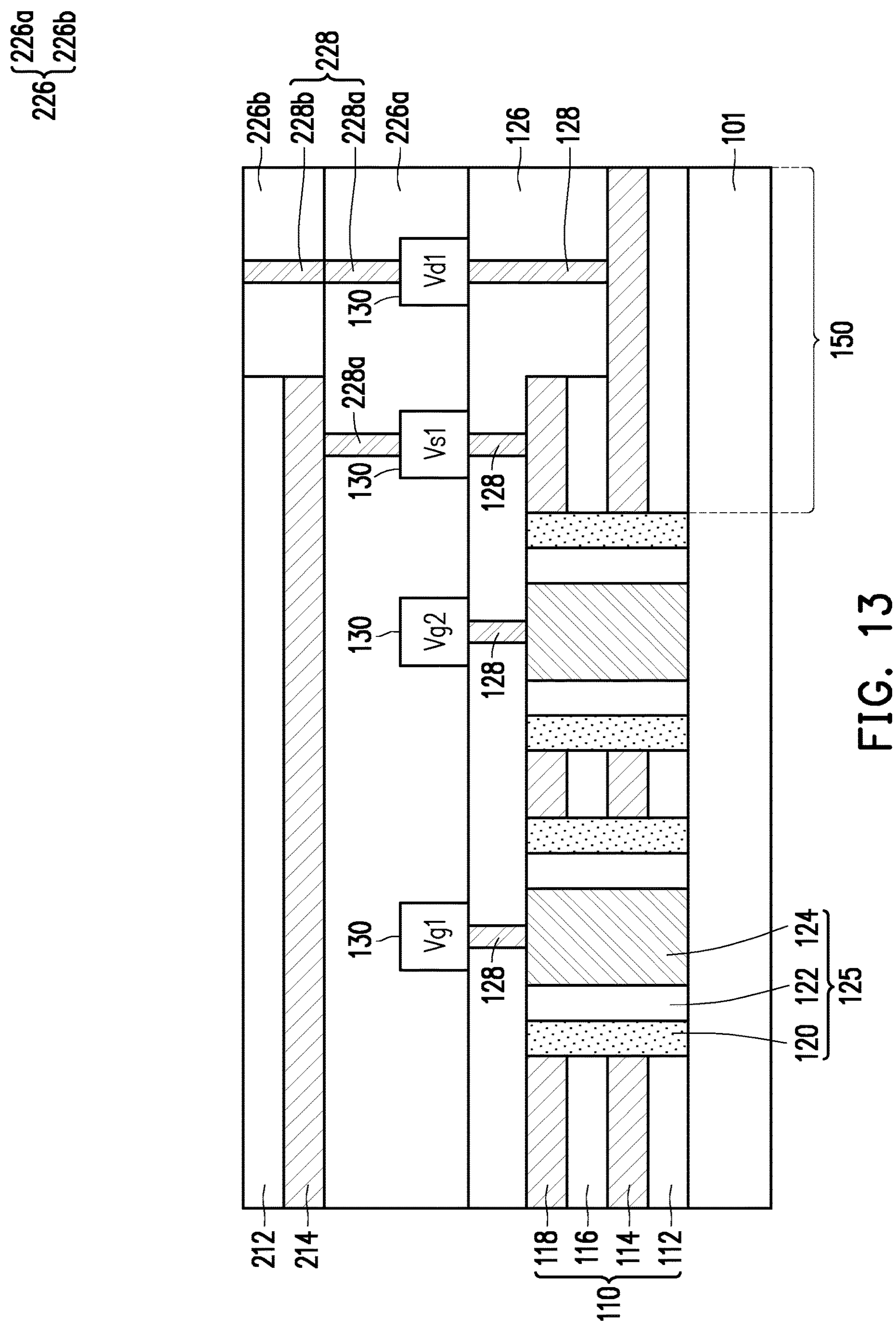

Referring to FIG. 13, a dielectric material 226*b* is formed aside the conductive layer 214 and the dielectric layer 212, and covers the dielectric material 226*a*. A contact 228*b* is formed on the contact 228*a* which is coupled to the connector 130 labeled Vd1. That is, the contact 228*a* is prolonged to reach the height of the top surface of the dielectric layer 212. The dielectric material 226*b* and the dielectric material 226*a* may have the same dielectric material, such as $SiO_2$. In other words, the dielectric materials 226*a* and 226*b* may be referred to as the same dielectric layer or film 226. In addition, the contacts 228*a* and 228*b* may have the same metal material, such as Cu. In other words, the contacts 228*a* and 228*b* may be referred to as the same contact plug or conductive via 228. In some embodiments, a length of the contact 228 contacting the connector 130 labeled Vd1 is greater than a length of the contact 228*a* contacting the connector 130 labeled Vs1.

Figure 14:
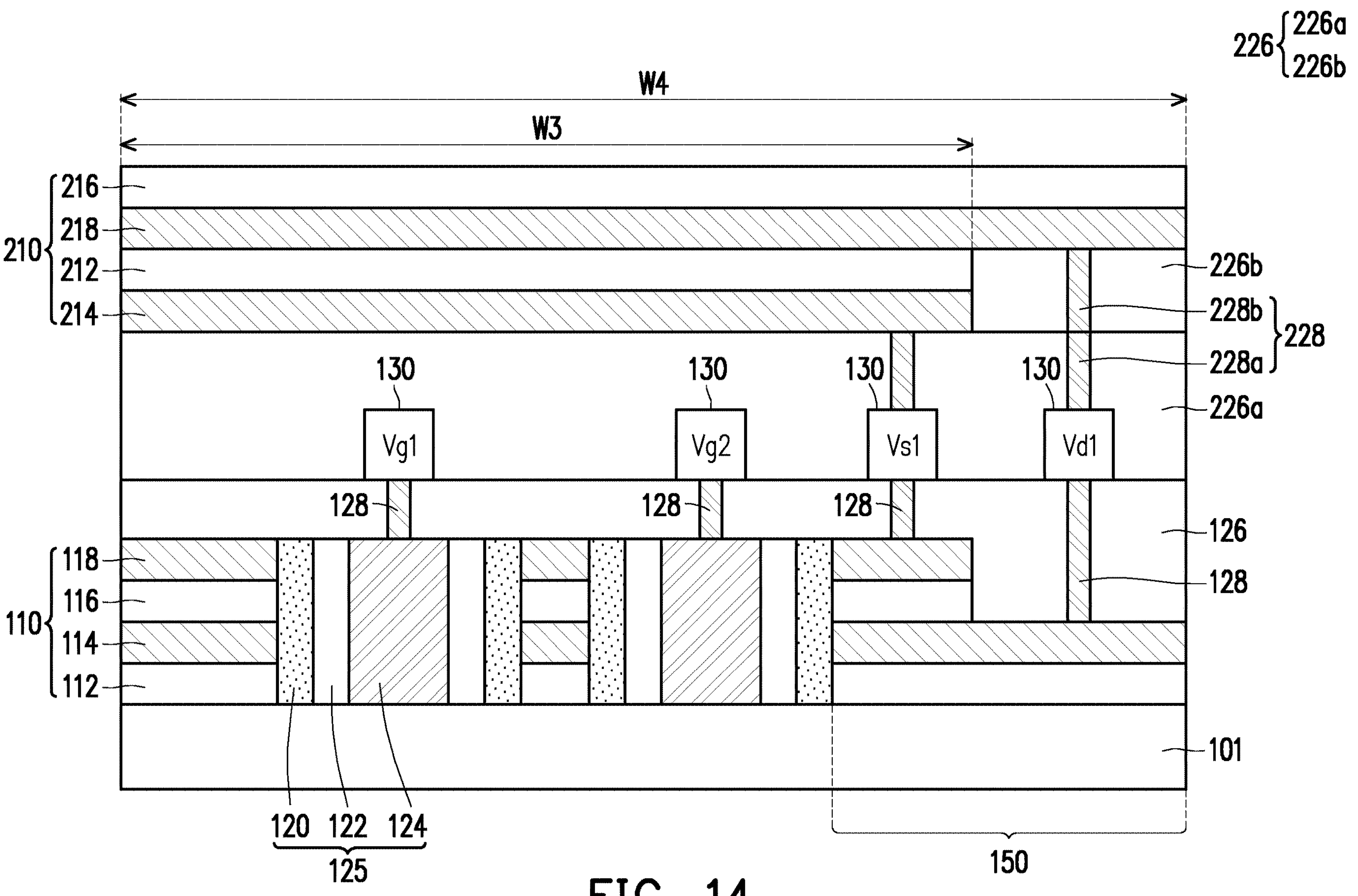

Referring to FIG. 14, a conductive layer 218 and a dielectric layer 216 are successively formed on the dielectric material 226*b* and the conductive layer 214, thereby forming a layer stack 210. Specifically, the conductive layer 218 is in physical contact with the contact plug 228 which is coupled to the connector 130 labeled Vd1. On the other hand, the conductive layer 214 is in physical contact with the contacts 228 which is coupled to the connector 130 labeled Vs1. In the example of FIG. 14, the dielectric layer 212 and the conductive layer 214 has a same width W3. The dielectric layer 216 and the conductive layer 218 has a same width W4 greater than the width W3. That is, the conductive layer 214 in the staircase shaped region 150 has a sidewall aligned along a same line with a respective sidewall of the dielectric layer 212.

The structure, material, and function of the conductive layer 218 and/or the dielectric layer 216 are similar to those of the conductive layer 118 and/or the dielectric layer 116 and have been described in the above embodiment, thus the details are omitted herein.

Figure 15:
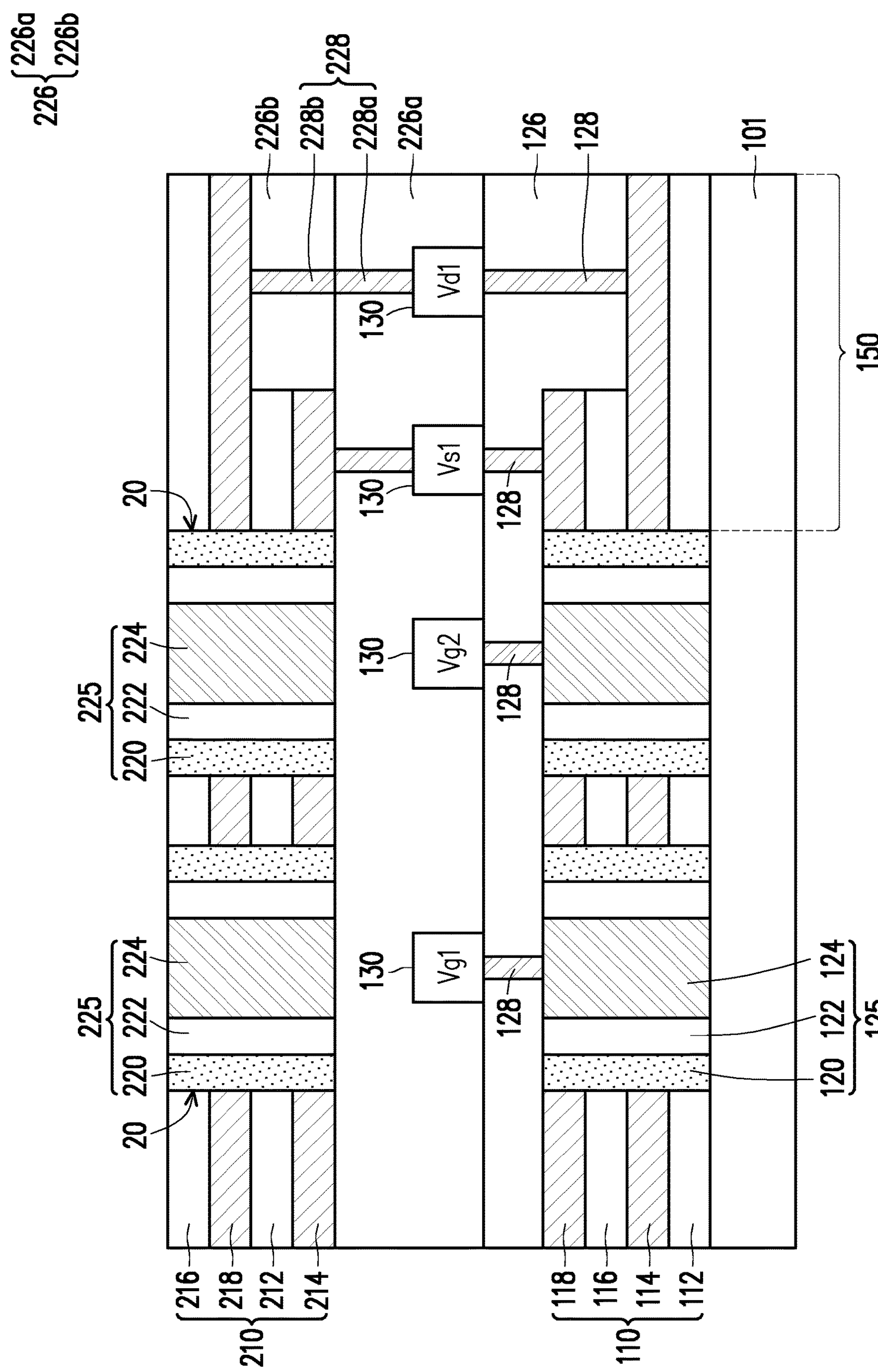

Referring to FIG. 15, a plurality of gate structures 225 are respectively formed in a plurality of openings 20 penetrating through the layer stack 210. In detail, each gate structure 225 may include a channel layer 220, a ferroelectric layer 222, and a conductive pillar 224. The ferroelectric layer 222 wraps the conductive pillar 224. The ferroelectric layer 222 is sandwiched between and in physical contact with the channel layer 220 and conductive pillar 224. The channel layer 220 is disposed between the layer stack 210 and the ferroelectric layer 222. That is, the channel layer 220 (or the gate structures 225) is surrounded by the dielectric layers 212, 216, and the conductive layers 214, 218. The structures, materials, and functions of the channel layer 220, the ferroelectric layer 222, and the conductive pillar 224 are similar to those of the channel layer 120, the ferroelectric layer 122, and the conductive pillar 124 and have been described in the above embodiment, thus the details are omitted herein.

Figure 16:
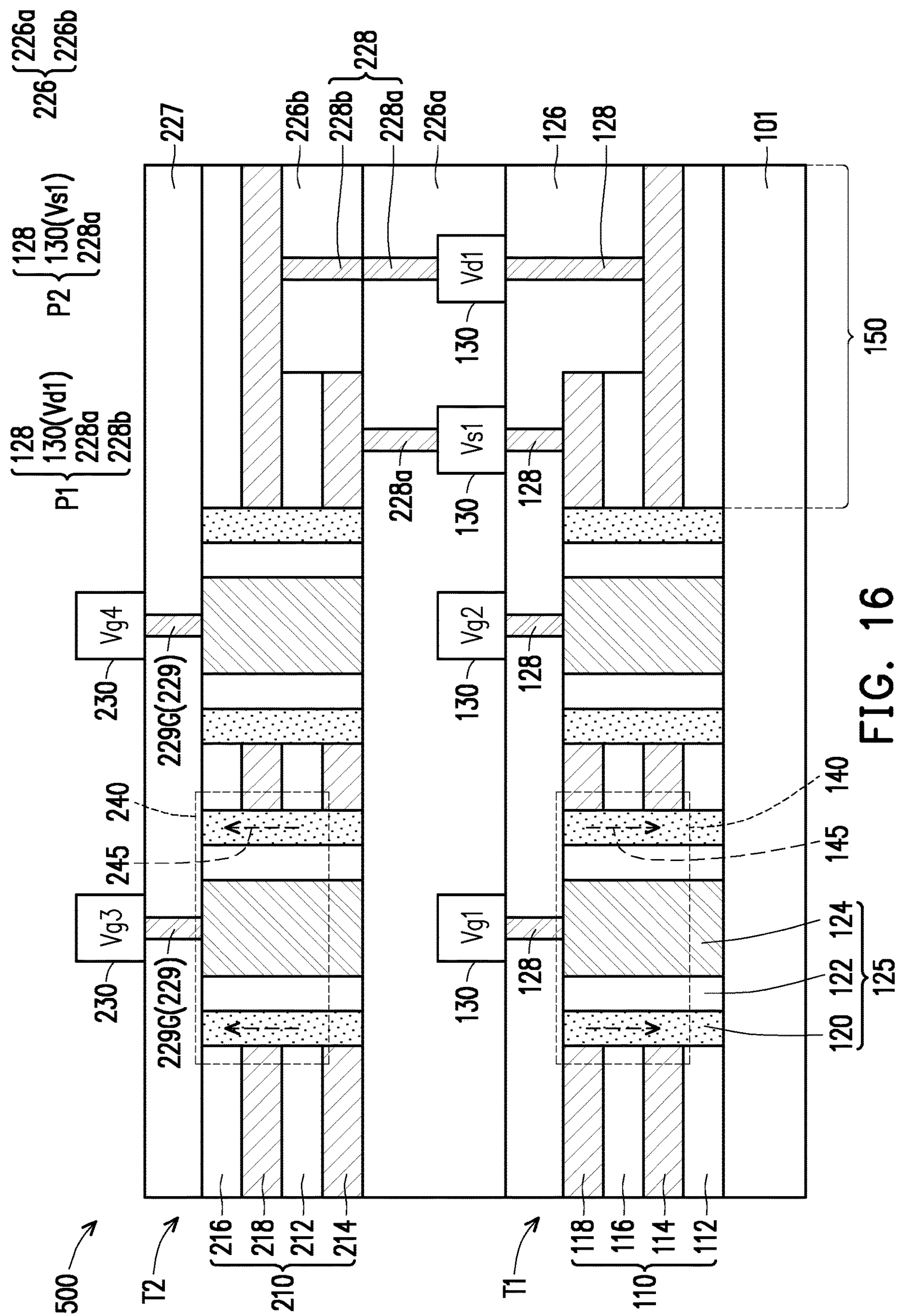

Referring to FIG. 16, a dielectric material 227 is formed over the structure of FIG. 15. A plurality of contacts 229 (also referred to as contact plugs) are then formed in the dielectric material 227 and electrically coupled to the conductive pillars 224. In some embodiments, the contacts 229 electrically coupled to the conductive pillars 224 are also referred to as gate contacts 229G. Next, a plurality of connectors 230 (also referred to as conductive connectors or conductive bumps) are formed over and electrically coupled to the contacts 229. The structures, materials, and functions of the dielectric material 227, the contacts 229, and the connectors 230 are similar to those of the dielectric material 126, the contacts 128, and the connectors 130 and have been described in the above embodiment, thus the details are omitted herein.

As show in FIG. 16, after forming the connectors 230, the memory device 500 is accomplished. In detail, the memory device 500 may include a first tier T1 on the substrate 101 and a second tier T2 stacked over the first tier T1. The first tier T1 may include the first layer stack 110 and the first gate structures 125 penetrating through the first layer stack 110. The second tier T2 may include the second layer stack 210 and the second gate structures 225 penetrating through the second layer stack 210. The memory device 500 further includes a first electrical path P1 and a second electrical path P2 in the staircase shaped region 150 between the first tier T1 and the second tier T2. The first electrical path P1 is electrically connected to the conductive layers 114 and 218, and has a first S/D voltage from the connector 130 labeled Vd1. The second electrical path P2 is electrically connected to the conductive layers 118 and 214, and has a second S/D voltage from the connector 130 labeled Vs1. That is, the conductive layers 114 and 218 share the first S/D voltage, while the conductive layers 118 and 214 share the second S/D voltage different from the first S/D voltage.

In addition, the dashed box in FIG. 16 also illustrates a memory cell 240 of the 3D memory device 500. The 3D memory device 500 includes a plurality of such memory cells. The memory cell 240 includes the second gate structure 225 penetrating through the second layer stack 210, and the conductive layers 214 and 218 (hereinafter called S/D layers 224). The second gate structure 225 may include the conductive pillar 224 (hereinafter called gate electrode 224), the ferroelectric layer 222 wrapping the gate electrode 224, the channel layer 220, and the channel layer 220 between the second layer stack 210 and the ferroelectric layer 222. Since the channel layer 220 is disposed between the S/D layers 214 and 218 of the second layer stack 210, each of the memory cells 240 of the 3D memory device 500 is a transistor with the ferroelectric layer 222, in the illustrated embodiment. The dashed arrows 245 in FIG. 16 illustrate possible current flow directions in the channel layer 220 when the transistor of the memory cell is turned on.

Due to the second tier T2 with the memory cells 240 stacked over the first tier T1 with the memory cells 140, the number of memory cells in the 3D memory device 500 is double that of the 3D memory device 100. In the example of FIG. 16, four memory cells are illustrated. To avoid clutter, besides the memory cells 140 and 240, the other memory cells are not marked by dashed boxes. The memory cell 140 can be programmed (e.g., written and/or read) through the connectors 130 that are electrically coupled to the gate and the S/D terminals of the transistor of the memory cell, e.g., the connectors 130 labeled Vg1, Vs1 and Vd1. Similarly, the connectors 130 labeled Vg2, Vs1, Vd1 can be used to program another memory cell disposed aside the memory cell 140. The memory cell 240 can be programmed through the connectors 230 and 130, where the connector 230 is electrically coupled to the gate terminal of the transistor of the memory cell, e.g., the connector 230 labeled Vg3, and the connectors 130 are electrically coupled to the S/D terminals of the transistor of the memory cell, e.g., the connectors 130 labeled Vs1 and Vd1. Similarly, the connectors 230 labeled Vg2, and the connectors 130 labeled Vs1, Vd1 can be used to program other memory cell disposed aside the memory cell 240. In some embodiments, the gate structures 125 and 225 are electrically independent to each other, so that the routing layout and operation are more flexible.

It should be noted that, in the present embodiment, the memory cells 240 are stacked on the memory cells 140 to allow for easy modification to increase the number of memory cells in the memory device, thereby improving the memory cell density. In addition, the dielectric material *226a* is disposed between the memory cells 140 and 240 to reduce or eliminate the leakage current between two vertically neighboring memory cells 140 and 240, thereby improving the device performance. As another example, while the disclosed embodiments illustrate two tiers T1 and T2 over the substrate 101, these embodiments are illustrative and not limiting. One skilled in the art will readily appreciate that more than two tiers may be formed over the substrate 101. This would allow more memory cells to be formed in the 3D memory device.

Figure 17:
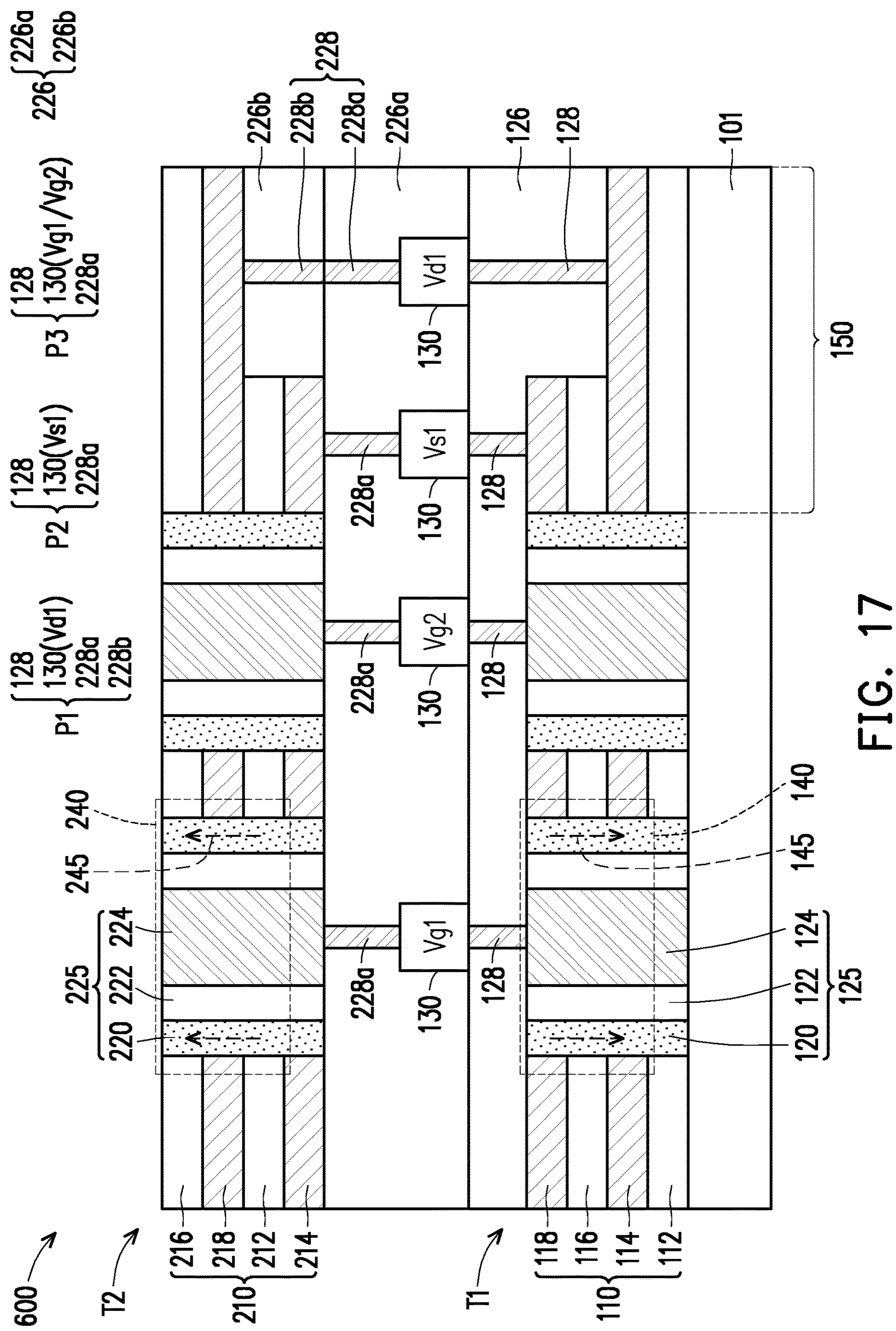
FIG. 17 is a cross-sectional view of a 3D memory device in accordance with a sixth embodiment.

FIG. 17 is a cross-sectional view of a 3D memory device 600 in accordance with a sixth embodiment.

The 3D memory device 600 is similar to the 3D memory device 500 of FIG. 16, that is, the structures, materials, and functions of the 3D memory device 600 are similar to those of the 3D memory device 500 and have been described in the above embodiment, thus the details are omitted herein. The main difference between the 3D memory devices 500 and 600 lies in that the gate structures 225 and 125 share the same gate voltage (Vg1 or Vg2) through a third electrical path P3 between the memory cells 140 and 240, thereby simplifying the circuit complexity.

Figure 18:
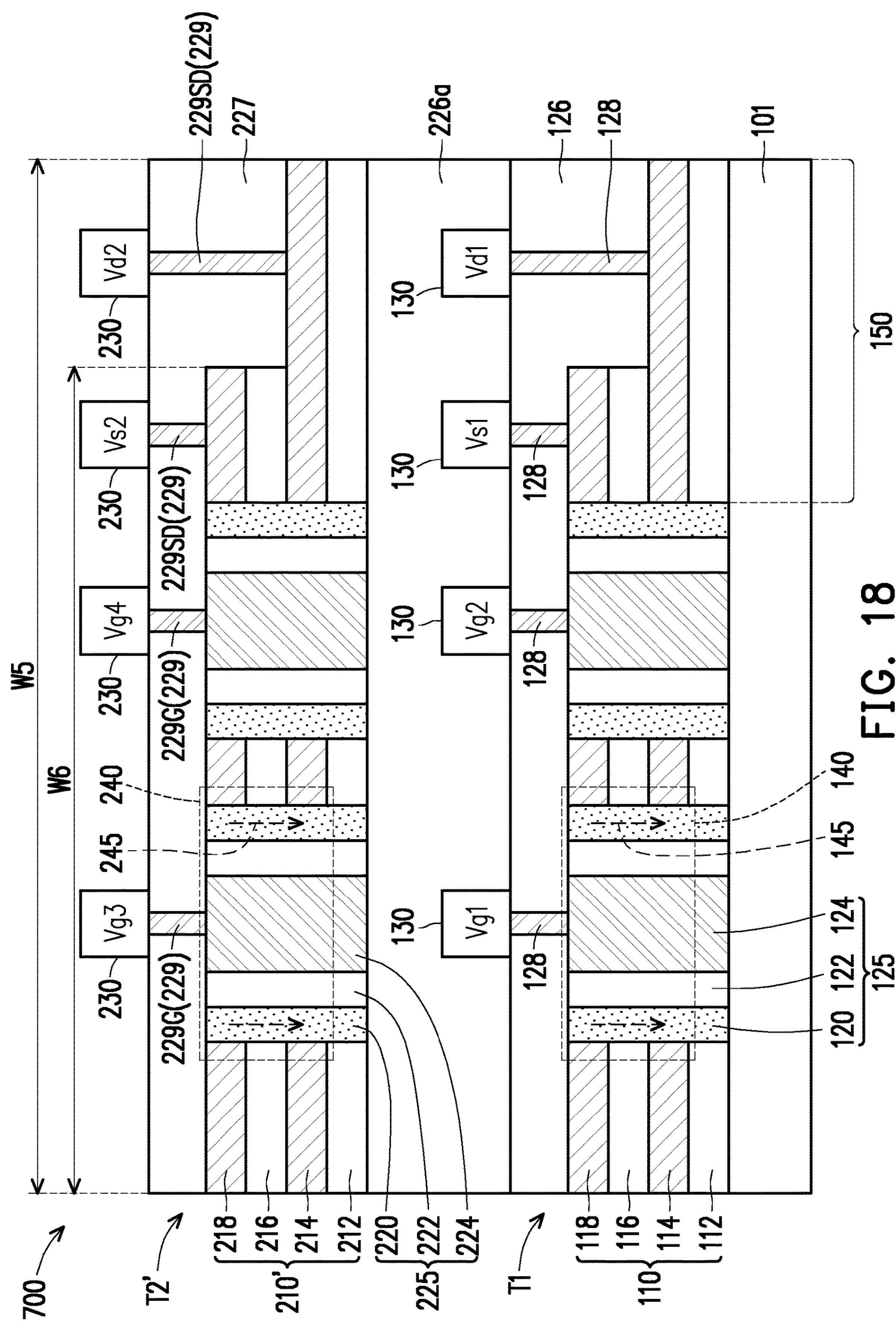
FIG. 18 is a cross-sectional view of a 3D memory device in accordance with a seventh embodiment.

FIG. 18 is a cross-sectional view of a 3D memory device 700 in accordance with a seventh embodiment.

The 3D memory device 700 is similar to the 3D memory device 500 of FIG. 16, that is, the structures, materials, and functions of the 3D memory device 700 are similar to those of the 3D memory device 500 and have been described in the above embodiment, thus the details are omitted herein. The main difference between the 3D memory devices 500 and 700 lies in that the conductive layers 114, 118, 214, and 218 of the memory device 700 are electrically independent to each other.

Specifically, the memory device 700 includes a second tier T2' stacked over the first tier T1. The second tier T2' may include a second layer stack 210' including the dielectric layer 212, the conductive layer 214, the dielectric layer 216, and the conductive layer 218 formed successively on the dielectric material 226*a*. In the example of FIG. 18, the dielectric layer 212 and the conductive layer 214 has a same width W5. The dielectric layer 216 and the conductive layer 218 has a same width W6 less than the width W5. That is, the conductive layer 218 in the staircase shaped region 150 has a sidewall aligned along a same line with a respective sidewall of the dielectric layer 216. The second gate structures 225 penetrate through the second layer stack 210'. The dielectric material 227 is formed over the second layer stack 210' and the second gate structures 225. The contacts 229 are formed in the dielectric material 227 and electrically coupled to the conductive pillars 224 or the conductive layers 214 and 218. In some embodiments, the contacts 229 electrically coupled to the conductive pillars 224 are also referred to as gate contacts 229G, and the contacts 229 electrically coupled to the conductive layers 214 and 218 (hereinafter called S/D layers) are also referred to as source/drain contacts 229SD. The connectors 230 are formed over and electrically coupled to the contacts 229.

In the example of FIG. 18, there are four connectors 130 and 230 (labeled Vg1, Vg2, Vg3, and Vg4), each of which is electrically coupled to a gate of a transistor of a memory cell. In addition, there are two connectors 130, labeled Vs1 and Vd1, where the two connectors 130 are coupled to the S/D layers 114 and 118 of a transistor of a memory cell. Further, there are two connectors 230, labeled Vs2 and Vd2, where the two connectors 230 are coupled to the S/D layers 214 and 218 of a transistor of a memory cell. Therefore, the example of FIG. 18 illustrates four memory cells, where each of the memory cells can be programmed by applying appropriate voltages to the gate and S/D terminals of the transistor of each memory cell.

It is noted that although only two tiers T1 and T2' are illustrated in FIG. 18, the embodiments of the present disclosure are not limited thereto. In other embodiments, more than two tiers may be formed over the substrate 101. This would allow more memory cells to be formed in the 3D memory device. The disclosed formation methods for the 3D memory devices can be easily integrated into existing BEOL process, thereby allowing integration of memory devices in various semiconductor devices at low production cost.

Furthermore, the first tier T1 of the 3D memory devices 500, 600, and 700 may be replaced by the structure 400 illustrated in FIG. 9. In this case, another tier or layer stack may be stacked under the bottom surface of the substrate 101, thereby increasing the memory cell density.

Figure 19:
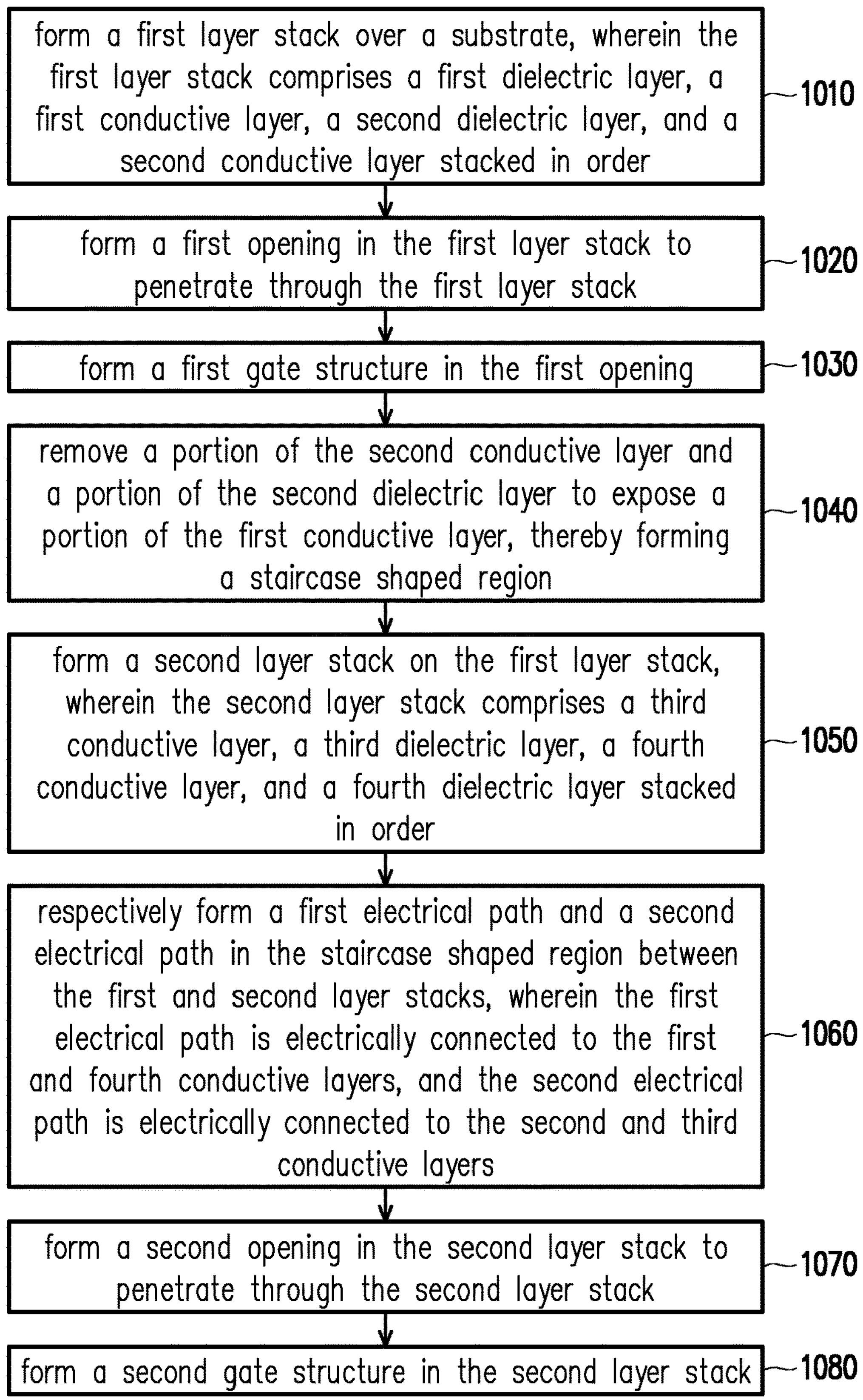
FIG. 19 illustrates a flow chart of a method of forming a 3D memory device in accordance with some embodiments.

FIG. 19 illustrates a flow chart 1000 of a method of forming a memory device in accordance with some embodiments. It should be understood that the embodiment method shown in FIG. 19 is merely an example of many possible embodiment methods. One of ordinary skill in the art would recognize many variations, alternatives, and modifications. For example, various steps as illustrated in FIG. 19 may be added, removed, replaced, rearranged, or repeated.

Referring to FIG. 19, at block 1010, a first layer stack is formed over a substrate, wherein the first layer stack comprises a first dielectric layer, a first conductive layer, a second dielectric layer, and a second conductive layer stacked in order. At block 1020, a first opening is formed in the first layer stack to penetrate through the first layer stack. At block 1030, a first gate structure is formed in the first opening. At block 1040, a portion of the second conductive layer and a portion of the second dielectric layer are removed to expose a portion of the first conductive layer, thereby forming a staircase shaped region. At block 1050, a second layer stack is formed on the first layer stack, wherein the second layer stack comprises a third conductive layer, a third dielectric layer, a fourth conductive layer, and a fourth dielectric layer stacked in order. At block 1060, a first electrical path and a second electrical path are respectively formed in the staircase shaped region between the first and second layer stacks, wherein the first electrical path is electrically connected to the first and fourth conductive layers, and the second electrical path is electrically connected to the second and third conductive layers. At block 1070, a second opening is formed in the second layer stack to penetrate through the second layer stack. At block 1080, a second gate structure is formed in the second layer stack, wherein the second gate structure and the first gate structure are electrically independent to each other.

In accordance with an embodiment, the memory device includes a first tier on a substrate and a second tier on the first tier. The first tier includes a first layer stack; a first gate electrode penetrating through the first layer stack; a first channel layer between the first layer stack and the first gate electrode; and a first ferroelectric layer between the first channel layer and the first gate electrode. The second tier includes a second layer stack; a second gate electrode penetrating through the second layer stack; a second channel layer between the second layer stack and the second gate electrode; and a second ferroelectric layer between the second channel layer and the second gate electrode.

In accordance with an embodiment, a method of forming a memory device includes: forming a first layer stack on a substrate, wherein the first layer stack comprises a first dielectric layer, a first conductive layer, a second dielectric layer, and a second conductive layer stacked in order; forming a first opening in the first layer stack to penetrate through the first layer stack; forming a first gate structure in the first opening; removing a portion of the second conductive layer and a portion of the second dielectric layer to expose a portion of the first conductive layer, thereby forming a staircase shaped region; forming a second layer stack on the first layer stack, wherein the second layer stack comprises a third conductive layer, a third dielectric layer, a fourth conductive layer, and a fourth dielectric layer stacked in order; respectively forming a first electrical path and a second electrical path in the staircase shaped region between the first and second layer stacks, wherein the first electrical path is electrically connected to the first and fourth conductive layers, and the second electrical path is electrically connected to the second and third conductive layers; forming a second opening in the second layer stack to penetrate through the second layer stack; and forming a second gate structure in the second layer stack, wherein the second gate structure and the first gate structure are electrically independent to each other.

In accordance with an embodiment, a memory device includes: a layer stack disposed on a substrate, wherein the layer stack comprises a first dielectric layer, a first source/drain (S/D) layer, a second dielectric layer, and a second S/D layer stacked in order; a first conductive pillar, penetrating through the layer stack; a first ferroelectric layer, wrapping the first conductive pillar; and a first channel layer, disposed between the layer stack and the first ferroelectric layer, wherein the first ferroelectric layer is in contact with the first channel layer and the first conductive pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a layer stack disposed on a substrate, wherein the layer stack comprises a first dielectric layer, a first source/drain (S/D) layer, a second dielectric layer, and a second S/D layer stacked in order;

a first conductive pillar, penetrating through the layer stack;

a first ferroelectric layer, wrapping the first conductive pillar;

a first channel layer, disposed between the layer stack and the first ferroelectric layer, wherein the first ferroelectric layer is in contact with the first channel layer and the first conductive pillar; and a first isolation structure, penetrating through in the first conductive pillar to divide the first conductive pillar into two individual first gate pillars, wherein the first isolation structure further divides the first ferroelectric layer into two individual ferroelectric pillars, and divides the first channel layer into two individual channel pillars.

2. The memory device of claim 1, wherein the two first gate pillars further extend to cover top surfaces of the two individual ferroelectric pillars, respectively.

3. The memory device of claim 1, wherein a portion of the first S/D layer is exposed by the second dielectric layer and the second S/D layer to form a staircase shaped region.

4. The memory device of claim 3, further comprising:

a first contact plug, disposed on the first S/D layer in the staircase shaped region; and a second contact plug, disposed on the second S/D layer in the staircase shaped region, wherein the first contact plug has a length greater than a length of the second contact plug.

5. The memory device of claim 1, further comprising:

a second conductive pillar, disposed aside the first conductive pillar and penetrating through the layer stack;

a second ferroelectric layer, wrapping the second conductive pillar; and a second channel layer, disposed between the layer stack and the second ferroelectric layer, wherein the second ferroelectric layer is in contact with the second channel layer and the second conductive pillar, and the first and second conductive pillars are electrically independent to each other.

6. The memory device of claim 5, further comprising: a second isolation structure embedded in the second conductive pillar to divide the second conductive pillar into two second gate pillars.

7. The memory device of claim 6, wherein the second isolation structure further divides the second ferroelectric layer into two individual ferroelectric pillars.

8. The memory device of claim 6, wherein the second isolation structure further divides the second channel layer into two individual channel pillars.

9. The memory device of claim 1, wherein a material of the first ferroelectric layer comprises HZO, HSO, HfSiO, HfLaO, $HfO_2$, $HfZrO_2$, $ZrO_2$, or $HfO_2$ doped by La, Y, Si, or Ge.

10. The memory device of claim 1, wherein a material of the first channel layer comprises indium gallium zinc oxide (IGZO), zinc oxide (ZnO), indium tungsten oxide (IWO), tungsten oxide (WO), tantalum oxide (TaO), molybdenum oxide (MoO), or a combination thereof.

11. The memory device of claim 1, wherein a material of the first isolation structure comprises silicon oxide, silicon nitride, or a combination thereof.

12. A memory device, comprising:

a layer stack disposed on a substrate, wherein the layer stack at least comprises two metal layers separated from each other;

a first gate structure comprising a first conductive pillar, a first ferroelectric layer, and a first channel layer;

a second gate structure comprising a second conductive pillar, a second ferroelectric layer, and a second channel layer, wherein the first and second gate structures penetrate through the layer stack, and the two metal layers laterally surround the first and second gate structures; and an isolation structure, disposed between the first and second gate structures, wherein the first conductive pillar and the second conductive pillar are divided into two individual conductive pillars by the isolation structure, the first ferroelectric layer and the second ferroelectric layer are divided into two individual ferroelectric layers by the isolation structure, and the first channel layer and the second channel layer are divided into two individual channel layers by the isolation structure, wherein the first gate structure is a mirror image of the second gate structure with respect to the isolation structure.

13. The memory device of claim 12, wherein the first gate structure comprises:

the first conductive pillar, having a straight first sidewall contacting the isolation structure and a curved second sidewall opposite to the first sidewall;

the first ferroelectric layer, conformally covering the curved second sidewall of the first conductive pillar;

the first channel layer, disposed between the layer stack and the first ferroelectric layer, wherein the first ferroelectric layer is in contact with the first channel layer and the first conductive pillar.

14. The memory device of claim 13, wherein a material of the first channel layer comprises indium gallium zinc oxide (IGZO), zinc oxide (ZnO), indium tungsten oxide (IWO), tungsten oxide (WO), tantalum oxide (TaO), molybdenum oxide (MoO), or a combination thereof.

15. The memory device of claim 12, wherein the second gate structure comprises:

the second conductive pillar, having a straight first sidewall contacting the isolation structure and a curved second sidewall opposite to the first sidewall;

the second ferroelectric layer, conformally covering the curved second sidewall of the second conductive pillar;

the second channel layer, disposed between the layer stack and the second ferroelectric layer, wherein the second ferroelectric layer is in contact with the second channel layer and the second conductive pillar.

16. The memory device of claim 13, wherein a material of the first ferroelectric layer comprises HZO, HSO, HfSiO, HfLaO, $HfO_2$, $HfZrO_2$, $ZrO_2$, or $HfO_2$ doped by La, Y, Si, or Ge.

* * * * *